(12) United States Patent
Lai et al.

(10) Patent No.: US 7,709,334 B2
(45) Date of Patent: May 4, 2010

(54) STACKED NON-VOLATILE MEMORY DEVICE AND METHODS FOR FABRICATING THE SAME

(75) Inventors: Erh-Kun Lai, Taichung (TW);
Hang-Ting Lue, Hsinchu (TW);
Kuang-Yeu Hsieh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 467 days.

(21) Appl. No.: 11/425,959

(22) Filed: Jun. 22, 2006

(65) Prior Publication Data

US 2007/0134855 A1 Jun. 14, 2007

Related U.S. Application Data

(60) Provisional application No. 60/748,807, filed on Dec. 9, 2005.

(51) Int. Cl.
*H01L 21/336* (2006.01)
(52) U.S. Cl. .................. 438/287; 438/142; 438/197; 438/261; 257/E29.316; 257/E29.126; 257/314
(58) Field of Classification Search .......... 257/E29.316, 257/E29.126, 314; 438/142, 287, 197, 261
See application file for complete search history.

(56) References Cited

U.S. PATENT DOCUMENTS

| | | | |
|---|---|---|---|
| 4,630,086 A | 12/1986 | Sato et al. | |
| 5,286,994 A | 2/1994 | Ozawa et al. | |
| 5,319,229 A | 6/1994 | Shimoji et al. | |
| 5,668,029 A | 9/1997 | Huang et al. | |
| 5,835,396 A | 11/1998 | Zhang | |
| 5,872,034 A * | 2/1999 | Schlais et al. | 438/257 |
| 5,883,409 A | 3/1999 | Guterman et al. | |
| 5,897,351 A * | 4/1999 | Forbes | 438/242 |
| 5,952,692 A | 9/1999 | Nakazato et al. | |
| 6,011,725 A | 1/2000 | Eitan et al. | |
| 6,026,026 A | 2/2000 | Chan et al. | |
| 6,074,917 A | 6/2000 | Chang et al. | |
| 6,169,693 B1 | 1/2001 | Chan et al. | |
| 6,218,700 B1 | 4/2001 | Papadas et al. | |

(Continued)

FOREIGN PATENT DOCUMENTS

EP        0016246        10/1980

(Continued)

OTHER PUBLICATIONS

Sung et al., "Multi-Layer SONOS with Direct Tunnel Oxide for High Speed and Long Retention Time," IEEE Silicon Nanoelectronics Workshop, Jun. 2002, pp. 83-84.*

(Continued)

*Primary Examiner*—Thanh V Pham
*Assistant Examiner*—Maria Ligai
(74) *Attorney, Agent, or Firm*—Haynes Beffel & Wolfeld LLP

(57) ABSTRACT

A stacked non-volatile memory device comprises a plurality of bit line and word line layers stacked on top of each other. The bit line layers comprise a plurality of bit lines that can be formed using advanced processing techniques making fabrication of the device efficient and cost effective. The device can be configured for NAND operation.

28 Claims, 24 Drawing Sheets

U.S. PATENT DOCUMENTS

| | | | |
|---|---|---|---|
| 6,322,903 B1 | 11/2001 | Siniaguine et al. | |
| 6,380,068 B2* | 4/2002 | Jeng et al. | 438/626 |
| 6,469,343 B1 | 10/2002 | Miura et al. | |
| 6,512,696 B1 | 1/2003 | Fan et al. | |
| 6,617,639 B1 | 9/2003 | Wang et al. | |
| 6,653,712 B2 | 11/2003 | Knall et al. | |
| 6,653,733 B1 | 11/2003 | Gonzalez et al. | |
| 6,709,928 B1 | 3/2004 | Jenne et al. | |
| 6,720,630 B2 | 4/2004 | Mandelman et al. | |
| 6,737,675 B2 | 5/2004 | Patel et al. | |
| 6,740,928 B2 | 5/2004 | Yoshii et al. | |
| 6,768,661 B2 | 7/2004 | Vyvoda et al. | |
| 6,784,480 B2 | 8/2004 | Bhattacharyya | |
| 6,818,558 B1 | 11/2004 | Rathor et al. | |
| 6,841,813 B2 | 1/2005 | Walker et al. | |
| 6,849,905 B2 | 2/2005 | Ilkbahar et al. | |
| 6,858,899 B2* | 2/2005 | Mahajani et al. | 257/347 |
| 6,897,533 B1 | 5/2005 | Yang et al. | |
| 6,912,163 B2 | 6/2005 | Zheng et al. | |
| 6,977,201 B2 | 12/2005 | Jung et al. | |
| 7,005,349 B2* | 2/2006 | Lee et al. | 438/261 |
| 7,057,234 B2* | 6/2006 | Tiwari | 257/324 |
| 7,075,828 B2 | 7/2006 | Lue et al. | |
| 7,115,469 B1 | 10/2006 | Halliyal et al. | |
| 7,115,942 B2 | 10/2006 | Wang | |
| 7,129,538 B2 | 10/2006 | Lee et al. | |
| 7,133,313 B2 | 11/2006 | Shih et al. | |
| 7,151,692 B2 | 12/2006 | Wu et al. | |
| 7,164,603 B2 | 1/2007 | Shih et al. | |
| 7,187,590 B2 | 3/2007 | Zous et al. | |
| 7,190,614 B2 | 3/2007 | Wu et al. | |
| 7,209,390 B2 | 4/2007 | Lue et al. | |
| 7,250,646 B2 | 7/2007 | Walker et al. | |
| 7,399,674 B2* | 7/2008 | Chen et al. | 438/264 |
| 2001/0055838 A1 | 12/2001 | Walker et al. | |
| 2003/0030100 A1 | 2/2003 | Lee et al. | |
| 2003/0032242 A1 | 2/2003 | Lee et al. | |
| 2003/0042534 A1 | 3/2003 | Bhattacharyya | |
| 2003/0047755 A1 | 3/2003 | Lee et al. | |
| 2003/0146465 A1 | 8/2003 | Wu | |
| 2003/0224564 A1 | 12/2003 | Kang et al. | |
| 2004/0079983 A1 | 4/2004 | Chae et al. | |
| 2004/0108512 A1* | 6/2004 | Iwata et al. | 257/100 |
| 2004/0119122 A1 | 6/2004 | Ilkbahar et al. | |
| 2004/0183126 A1 | 9/2004 | Bae et al. | |
| 2004/0256679 A1 | 12/2004 | Hu | |
| 2005/0006696 A1 | 1/2005 | Noguchi et al. | |
| 2005/0023603 A1 | 2/2005 | Eldridge et al. | |
| 2005/0062098 A1 | 3/2005 | Mahajani et al. | |
| 2005/0074937 A1 | 4/2005 | Jung | |
| 2005/0093054 A1 | 5/2005 | Jung | |
| 2005/0219906 A1 | 10/2005 | Wu | |
| 2005/0237801 A1 | 10/2005 | Shih | |
| 2005/0237809 A1 | 10/2005 | Shih et al. | |
| 2005/0237813 A1 | 10/2005 | Zous et al. | |
| 2005/0237815 A1 | 10/2005 | Lue et al. | |
| 2005/0237816 A1 | 10/2005 | Lue et al. | |
| 2005/0270849 A1 | 12/2005 | Lue | |
| 2005/0281085 A1 | 12/2005 | Wu | |
| 2006/0198189 A1 | 9/2006 | Lue et al. | |
| 2006/0198190 A1 | 9/2006 | Lue | |
| 2006/0202252 A1 | 9/2006 | Wang et al. | |
| 2006/0202261 A1 | 9/2006 | Lue et al. | |
| 2006/0258090 A1 | 11/2006 | Bhattacharyya et al. | |
| 2006/0261401 A1 | 11/2006 | Bhattacharyya | |
| 2006/0281260 A1 | 12/2006 | Lue | |
| 2007/0012988 A1 | 1/2007 | Bhattacharyya | |
| 2007/0029625 A1 | 2/2007 | Lue et al. | |
| 2007/0031999 A1 | 2/2007 | Ho et al. | |
| 2007/0045718 A1 | 3/2007 | Bhattacharyya | |
| 2007/0069283 A1 | 3/2007 | Shih et al. | |
| 2007/0138539 A1 | 6/2007 | Wu et al. | |

FOREIGN PATENT DOCUMENTS

| | | |
|---|---|---|
| EP | 1411555 | 4/2004 |
| EP | 01677311 | 7/2006 |
| EP | 01677312 | 7/2006 |
| JP | 11040682 | 2/1999 |
| JP | 2002368141 | 12/2002 |
| JP | 2004363329 | 12/2004 |

OTHER PUBLICATIONS

Aminzadeh et al., "Conduction and Charge Trapping in Polysilicon-Silicon Nitride-Oxide-Silicon Structures under Positive Gate Bias," IEEE Trans. on Electron Dev. 35(4) Apr. 1998 459-467.

Baik, Seung et al., "High Speed and Nonvolatile Si Nanocrystal Memory for Scaled Flash Technology Using Highly Field-Sensitive Tunnel Barrier," IEEE IEDM 03-545, 22.3.1-22.3.4.

Blomme et al., "Multilayer tunneling barriers for nonvolatile memory applications," Device Research Conf, 2002 60th DRC Digest 153-154.

Blomme et al., "Write/Erase Cycling Endurance of Memory Cells with SiO2/HfO2 Tunnel Dielectric," IEEE Trans. on Dev. and Materials Reliability 4(3), Sep. 2004 345-351.

Buckley, J., et al., "Engineering of 'Conduction Band—Crested Barriers' or 'Dielectric Constant—Crested Barriers' in view of their application of floating-gate non-volatile memory devices," VLSI 2004, 55-56.

Chindalore, et al., "A New Combination-Erase Technique for Erasing Nitride Based (SONOS) Nonvolatile Memories," IEEE Electron Dev. Lett. 24(4) Apr. 2003, 257-259.

Cho et al., "Simultaneous Hot-Hole Injection at Drain and Source for Efficient Erase and Excellent Endurance in SONOS Flash EEPROM Cells," IEEE Electron Device Letters 24(4) Apr. 2003 260-262.

DiMaria, D.J., et al., "Conduction Studies in Silicon Nitride: Dark Currents and Photocurrents," IBM J. Res. Dev., May 1977, 227-244.

Eitan, et al., "NROM: A Novel Localized Trapping, 2-Bit Nonvolatile Memory Cell," IEEE Electron Device Lett 21(11) Nov. 2000, 543-545.

Govoreanu et al., "An Investigation of the Electron Tunneling Leakage Current Through Ultrathin Oxides/High-k Gate Stacks at Inversion Conditions," IEEE SISPAD Intl. Conf. Sep. 3-5, 2003 287-290.

Govoreanu et al., "Simulation of Nanofloating Gate Memory with High-k Stacked Dielectrics," IEEE SISPAD Intl. Conf. Sep. 3-5, 2003 299-302.

Govoreanu et al., "VARIOT: A Novel Multilayer Tunnel Barrier Concept for Low-Voltage Nonvolatile Memory Devices," IEEE Electron Dev. Lett. 24(2) Feb. 2003 94-101.

Hijaya, S., et al., "High-Speed Write/Erase EAROM Cell with Graded Energy Band-Gap Insulator," Electronics and Communications in Japan, Part 2, vol. 68, No. 2, Jun. 6, 1984, 28-36.

Hinkle, C.L., et al., "Enhanced Tunneling in stacked gate dielectrics with ultra-thin HfO2 (ZrO2) layers sandwiched between thicker SiO2 layers," Surface Science, Sep. 20, 2004, vol. 566-568, 1185-1189.

Ito, et al., "A Novel MNOS Technology Using Gate Hole Injection in Erase Operation for Embedded Nonvolatile Memory Applications," 2004 Symp. on VLSI Tech Dig. of Papers 2004, 80-81.

Kim et al., "Robust Multi-Bit Programmable Flash Memory Using a Resonant Tunnel Barrier," Electron Dev. Mtg. Dec. 5-7, 2005, IEDM Technical Digest 861-864.

Lee, Chang, et al., "A Novel SONOS Structure of SiO2/SiN/Al2O3 with TaN Metal Gate for Multi-Giga Bit Flash Memeries," IEEE 2003 4 pages.

Lee, Chungho, et al., "Operational and Reliability Comparison of Discrete-Storage Nonvolatile Memories: Advantages of Single-and Double-Layer Metal Nanocrystals," IEEE IEDM 03-557, 22.6.1-22.6.4.

Likharev, "Layered Tunnel Barriers for Nonvolatile Memory Devices," Appl. Phys. Lett. 73(15) Oct. 1998 2137-2139.

Lue et al., "A Novel P-Channel NAND-Type Flash memory with 2-bit/cell Operation and High Programming Throughput (>20 MB/sec)," IEEE 2005, 4 pages.

Minami, et al., "New Scaling Guidelines for MNOS Nonvolatile Memory Devices," IEEE Trans on Electron Devices 38(11) Nov. 1991 2519-2526.

Shih et al., "A Novel 2-bit/cell Nitride Storage Flash Memory with Greater than 1M P/E-cycle Endurance," IEEE IEDM 2004 881-884 (36.3.1-36.3.4).

Takata, M., et al., "New Non-Volatile Memory with Extremely High Density Metal Nano-Dots," IEEE IEDM 03-553, (2003) 22.5.1-22.5.4.

Walker et al., "3D TFT-SONOS Memory Cell for Ultra-High Density File Storage Applications," 2003 Symposium on VLSI Tech Digest of Technical Papers, 29-30.

White et al., "On the Go with SONOS" IEEE Circuits and Devices, Jul. 2000, 22-31.

Yamada et al., "A self-convergence erasing scheme for a simple stacked gate flash EEPROM," Proc. Int'l. Electron Devices Meeting, Dec. 1991 307-310.

Yeh, C.C., et al., PHINES: A Novel Low Power Program/Erase, Small Pitch, 2-Bit per Cell Flash Memory, IEDM Tech. Digest, 2002, 931-934.

Office Action in U.S. Appl. No. 11/549,520, Mailed Jun. 30, 2008, 12 pages.

Notice of Allowance in U.S. Appl. No. 11/549,520, mailed Sep. 11, 2008, 8 pages.

Office Action in U.S. Appl. No. 11/549,520 mailed Feb. 13, 2008, 11 pages.

Response/Amendment filed Aug. 1, 2008 in U.S. Appl. No. 11/549,520, 8 pages.

Response/Amendment filed Apr. 25, 2008 in U.S. Appl. No. 11/549,520, 13 pages.

Lue et al., "BE-SONOS: A Bandgap Engineered SONOS with Excellent Performance and Reliability," IEDM Tech. Digest Dec. 2005 547-550.

Search Report mailed May 9, 2008 in European Application No. 06000064.3 filed on Jan. 3, 2006, 3 pages.

Search Report mailed May 9, 2008 in European Application No. 06000093.2 (Pub. No. EP-01677312) filed on Jan. 3, 2006, 4 pages.

Search Report mailed Feb. 14, 2007 in European Application No. 06000064.3 filed on Jan. 3, 2006, 7 pages.

Search Report mailed Feb. 14, 2007 in European Application No. 06000093.2 (Pub. No. EP-01677312) filed on Jan. 3, 2006, 7 pages.

Search Report mailed Nov. 14, 2007 in European Application No. 06000064.3 filed on Jan. 3, 2006, 4 pages.

Search Report mailed Nov. 14, 2007 in European Application No. 06000093.2 (Pub. No. EP-01677312) filed on Jan. 3, 2006, 4 pages.

\* cited by examiner

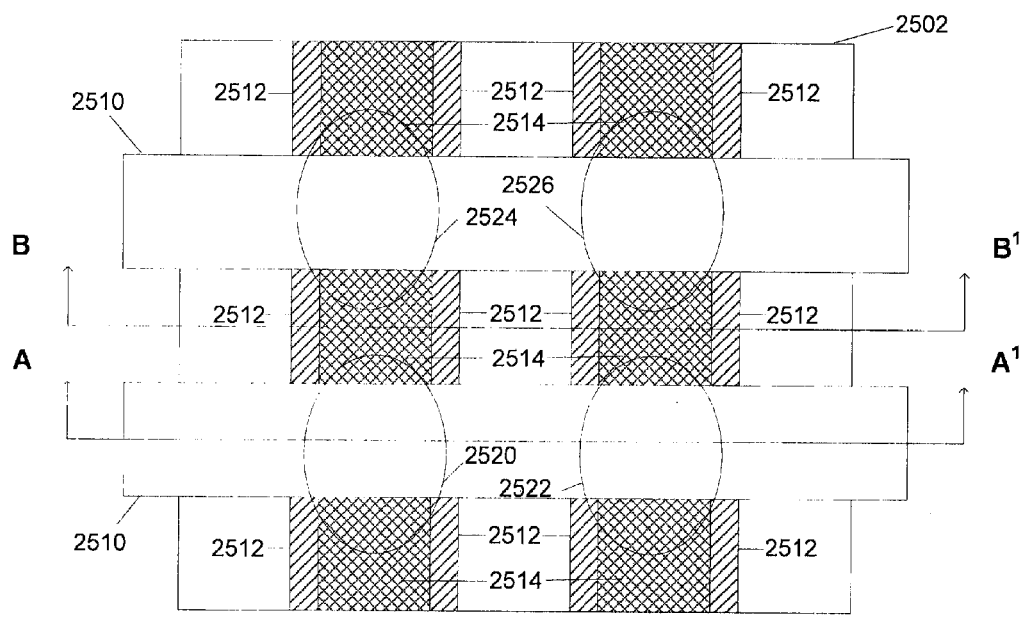
FIG. 34
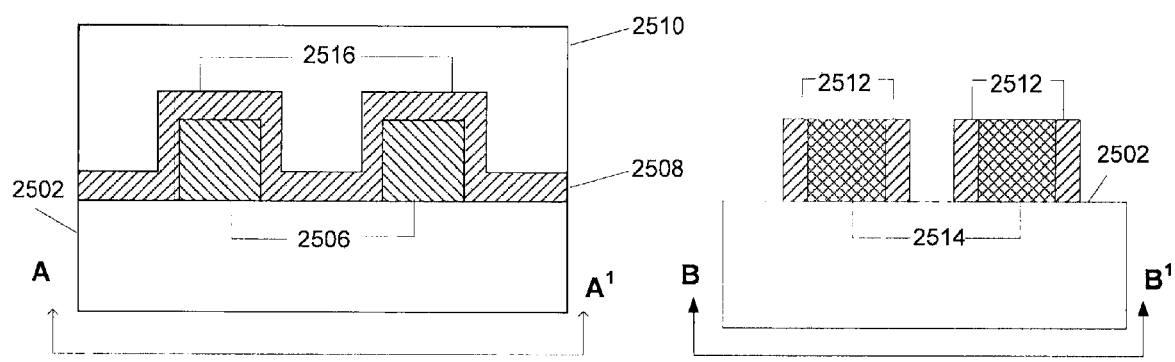
FIG. 32
FIG. 33

STACKED NON-VOLATILE MEMORY DEVICE AND METHODS FOR FABRICATING THE SAME

RELATED APPLICATION

This application claims the priority under 35 U.S.C. 119(e) to U.S. Provisional Application 60/748,807, entitled "Process of Multi Layer NAND NROM" filed Dec. 9, 2005, which is incorporated herein by reference in its entirety.

BACKGROUND

1. Field of the Invention

The embodiments described herein are directed to non-volatile memory devices and methods for fabricating the same, and more particularly to stacked non-volatile memory devices and methods for fabricating the same.

2. Background of the Invention

Non-volatile memory devices are finding uses in more and more products. For example, flash-based memory devices are being used in MP3 players, digital cameras, as storage devices for computer files, etc. As these uses grow, there is a need for larger memories housed in smaller packages. This requires the fabrication of highly dense memories. Accordingly, research and development has been directed at increasing the density of conventional non-volatile memory devices.

One approach for increasing the density of non-volatile memory devices is to create a stacked memory device, i.e., a device in which layers of memory cells are stacked on top of each other. Unfortunately, to date little effort has been put into creating certain types of stacked memory devices. For example, there are few stacked nitride read-only memory designs. This is in part because stacked memory devices are not necessarily compatible with the latest fabrication processes, which can make fabricating a stacked memory device inefficient and costly.

There are other approaches to increasing the density of conventional non-volatile memory devices, however, these approaches do not necessarily address the needs of all applications. Accordingly, there is still a need for further, or other approaches for increasing the density of conventional non-volatile memory devices.

One particular type of non-volatile memory device is the nitride read-only memory device. FIG. 1 is a diagram illustrating a conventional nitride read-only memory structure 150. As can be seen, nitride read-only memory 150 is constructed on a silicon substrate 152. The silicon substrate can be a P-type silicon substrate or an N-type silicon substrate. However, for various design reasons P-type silicon substrates are often preferred. Source/drain regions 154 and 156 can then be implanted in substrate 152. A trapping structure 158 is then formed on substrate 152 between source/drain regions 154 and 156. Control gate 160 is then formed on top of trapping structure 158.

Source/drain regions 154 and 156 are silicon regions that are doped to be the opposite type as that of substrate 152. For example, where a P-type silicon substrate 152 is used, N-type source/drain regions 154 and 156 can be implanted therein.

Charge trapping structure 158 comprises a nitride trapping layer as well as an isolating oxide layer between the trapping layer and channel 166 in substrate 152. In other embodiments, trapping structure 158 can comprise a nitride trapping layer sandwiched between two isolating, or dielectric layers, such as oxide, or more specifically as silicon dioxide layers. Such a configuration is often referred to as an Oxide-Nitride-Oxide (ONO) trapping structure.

Charge can be accumulated and confined within trapping structure 158 next to source/drain regions 154 and 156, effectively storing two separate and independent charges 162 and 164. Each charge 162 and 164 can be maintained in one of two states, either programmed or erased, represented by the presence or absence of a pocket of trapped electrons. This enables the storage of two bits of information without the complexities associated with multilevel cell technology.

Each storage area in nitride read-only memory cell 150 can be programmed independently of the other storage area. A nitride read-only memory cell is programmed by applying a voltage that causes negatively charged electrons to be injected into the nitride layer of trapping structure 158 near one end of the cell. Erasing is accomplished by applying voltages that cause holes to be injected into the nitride layer where they can compensate for electrons previously stored in the nitride layer during programming.

A nitride read-only memory device is constructed by manufacturing arrays of memory cells such as the cell illustrated in FIG. 1. Arrays are constructed by tying the cells together via word and bit lines.

While nitride read-only memory devices, such as the device illustrated in FIG. 1, can be configured to store multiple bits per cell, the density of nitride read-only memory devices can be increased by using a stacked construction. Unfortunately, the stacking of nitride read-only memory devices is rarely done and when it is, the process can be inefficient and therefore costly.

SUMMARY

Methods for fabricating a stacked non-volatile memory device are disclosed. The methods disclosed use efficient processing techniques in order to fabricate a stacked device. Accordingly, the embodiments described herein can be scaled to achieve various levels of stacking.

In one aspect, a stacked nitride read-only memory can be fabricated using the methods described herein.

In another aspect, the stacked nitride read-only memory device can be fabricated using Silicon On Insulator (SOI) processing techniques, for example, thin-film transistor (TFT) processing techniques.

In another aspect, a stacked memory device fabricated using the methods described herein can be configured for NAND operation.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which:

FIGS. 25-35 are diagrams illustrating processing steps comprising an example process for fabricating the device of FIG. 24 in accordance with one embodiment.

DETAILED DESCRIPTION

It will be understood that any dimensions, measurements, ranges, test results, numerical data, etc. presented below are approximate in nature and unless otherwise stated not intended as precise data. The nature of the approximation involved will depend on the nature of the data, the context, and the specific embodiments or implementations being discussed.

Figure 2:
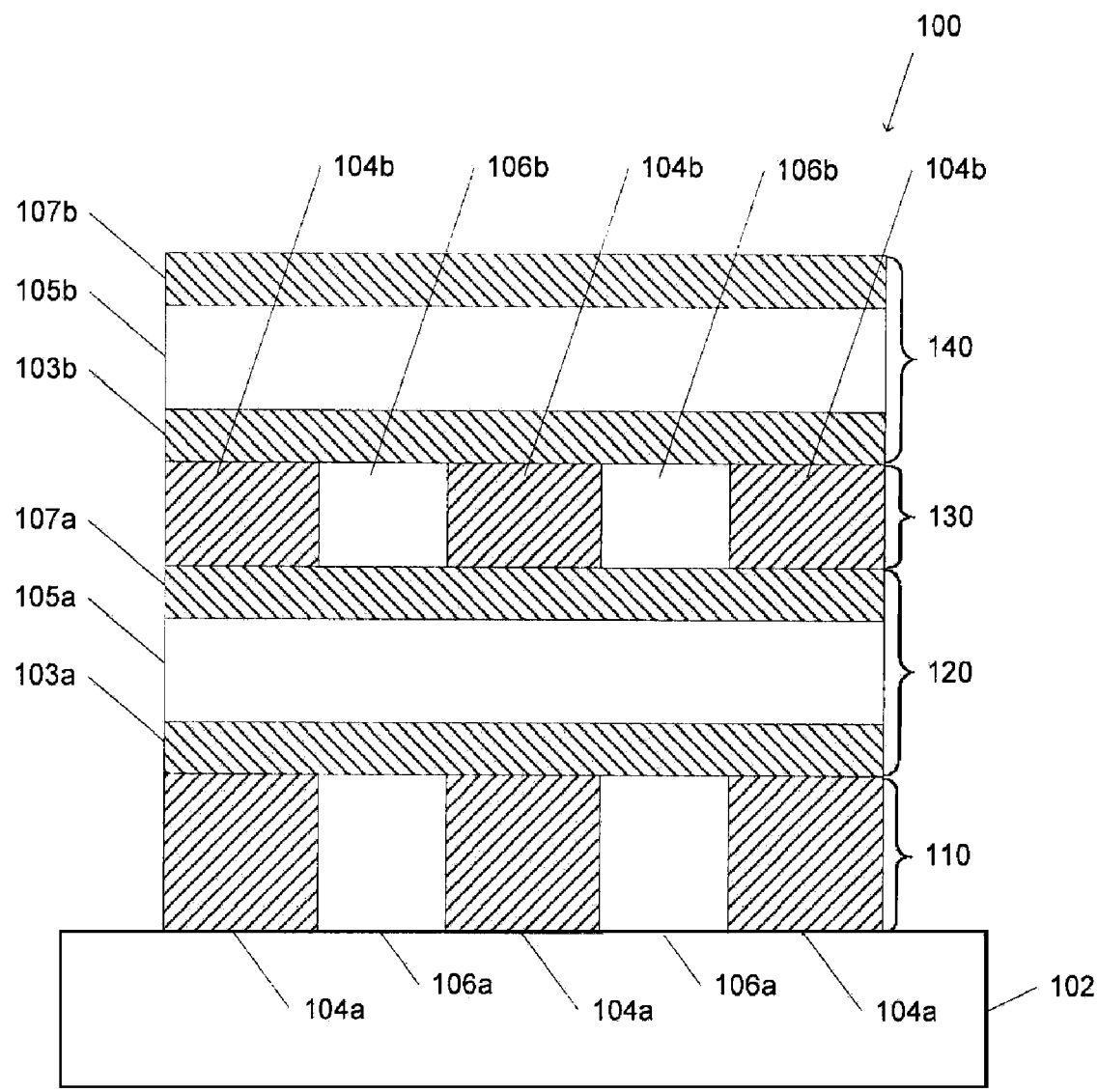
FIG. 2 is a diagram illustrating a stacked nitride read-only memory structure in accordance with one embodiment.

FIG. 2 is a diagram illustrating an example stacked nitride read-only memory 100 in accordance with one embodiment. In the example of FIG. 2, the stacked nitride read-only memory 100 is fabricated on top of an insulating layer 102. Accordingly, device 100 is fabricated using SOI processing techniques. For example, device 100 can be fabricated using thin film transistor (TFT) processing techniques. Successive bit line layers and word line layers can then be fabricated on insulating layer 102. For example in FIG. 2 a first bit line layer 110 is fabricated on insulating layer 102. A first word line layer 120 is then fabricated on top of first bit line layer 110. A second bit line layer 130 is then fabricated on top of first word line layer 120. Finally, a second word line layer 140 is fabricated on top of second bit line layer 130.

Figure 1:
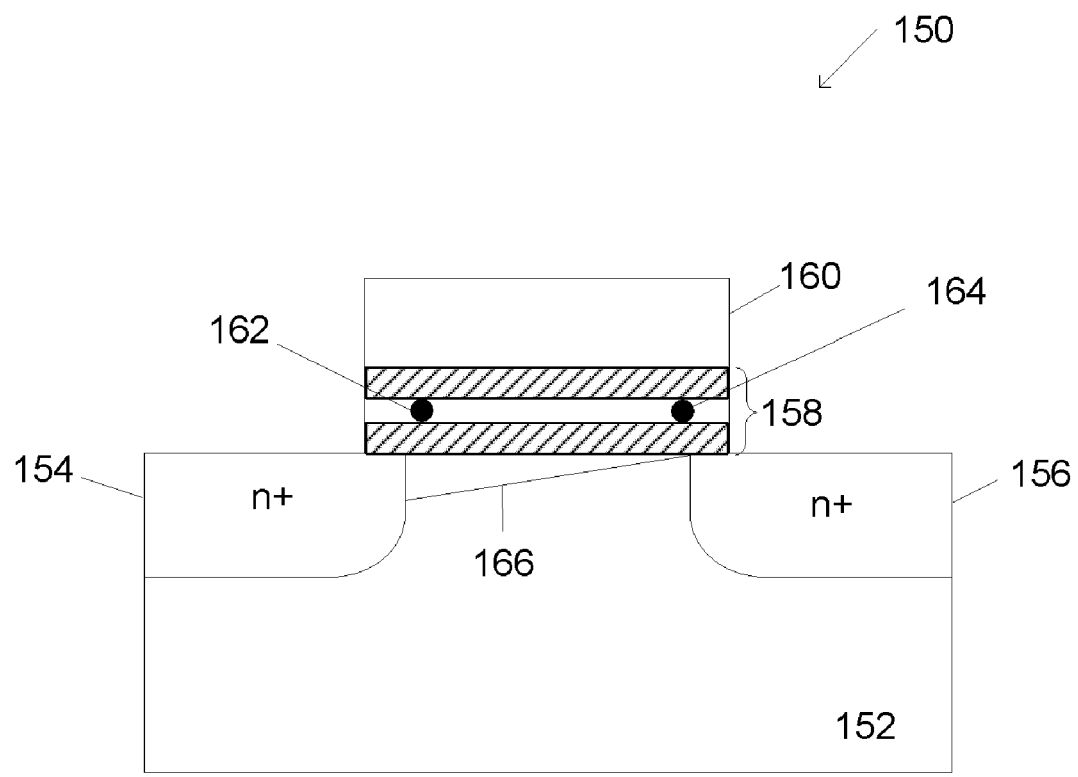
FIG. 1 is a diagram illustrating a conventional nitride read-only memory structure.

Further bit line and word line layers can be successively fabricated on top of the layers illustrated in FIG. 1. Thus, two bit line layers and two word line layers are shown for convenience only and the methods described herein should not be seen as limited to a certain number of bit line layers and/or word line layers. Each bit line layer 110 and 130 comprises a plurality of bit lines 104 separated by insulating regions 106. Each word line layer 120 and 140 comprises a word line conductor 105 sandwiched between trapping layers 103 and 107.

By using the stacked configuration illustrated in FIG. 2, greater memory densities can be achieved. Further, as explained below, efficient processing techniques can be used to fabricate structure 100.

Figure 3:
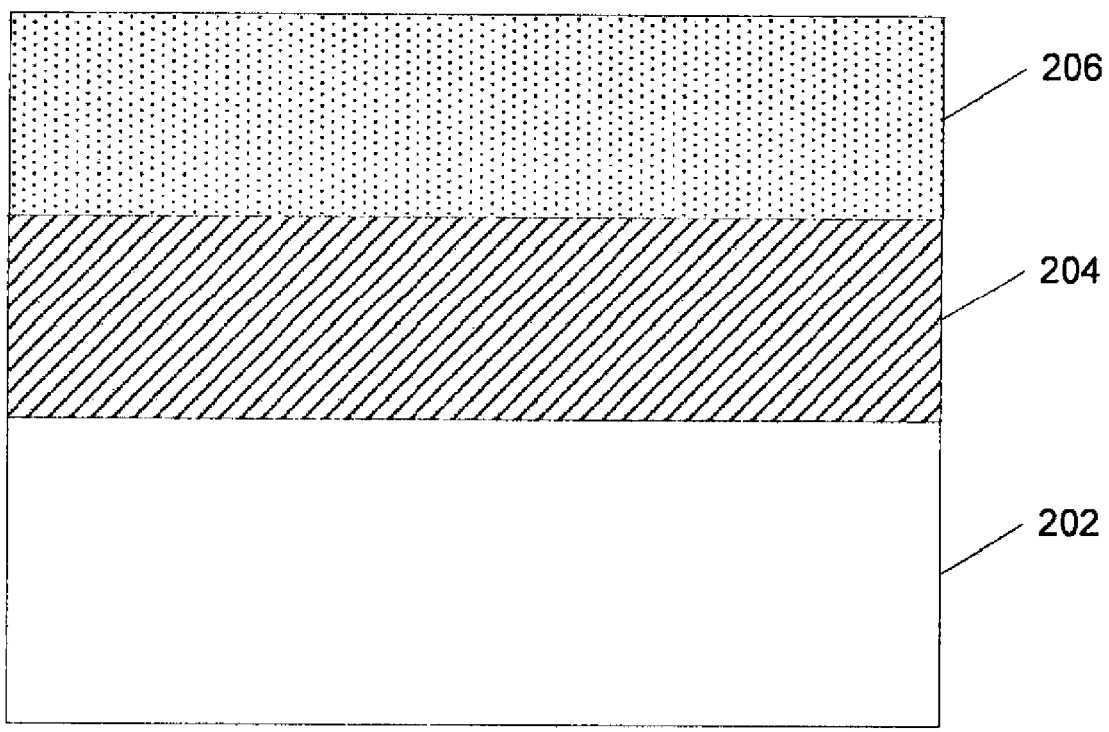
FIGS. 3-21 are diagrams illustrating an example progression of steps for fabricating the stacked nitride read-only memory of FIG. 2 in accordance with one embodiment.

FIGS. 3-21 are diagrams illustrating an example sequence of steps for fabricating structure 100 in accordance with one embodiment. As illustrated in FIG. 3, a semiconductor layer 204 can be formed on an insulating layer 202. In certain embodiments, for example, insulating layer 202 can comprise an oxide material. Semiconductor layer 204 can comprise a P-type semiconductor material, such as silicon (Si), germanium (Ge), or silicon germanium (SiGe). It can be preferable, for example, for layer 204 to comprise a thin film polysilicon deposited on insulating layer 202. It will be understood that in other embodiments, semiconductor layer 204 can comprise N-type semiconductor material. A cap layer 206 can then be formed over semiconductor layer 204. In certain embodiments, for example, cap layer 206 can comprise a silicon nitride (SiN) material.

Figure 4:
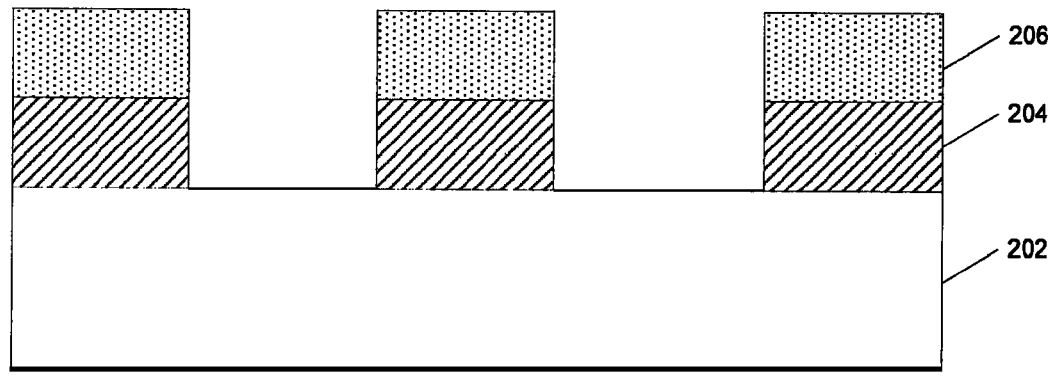
Figure 5:
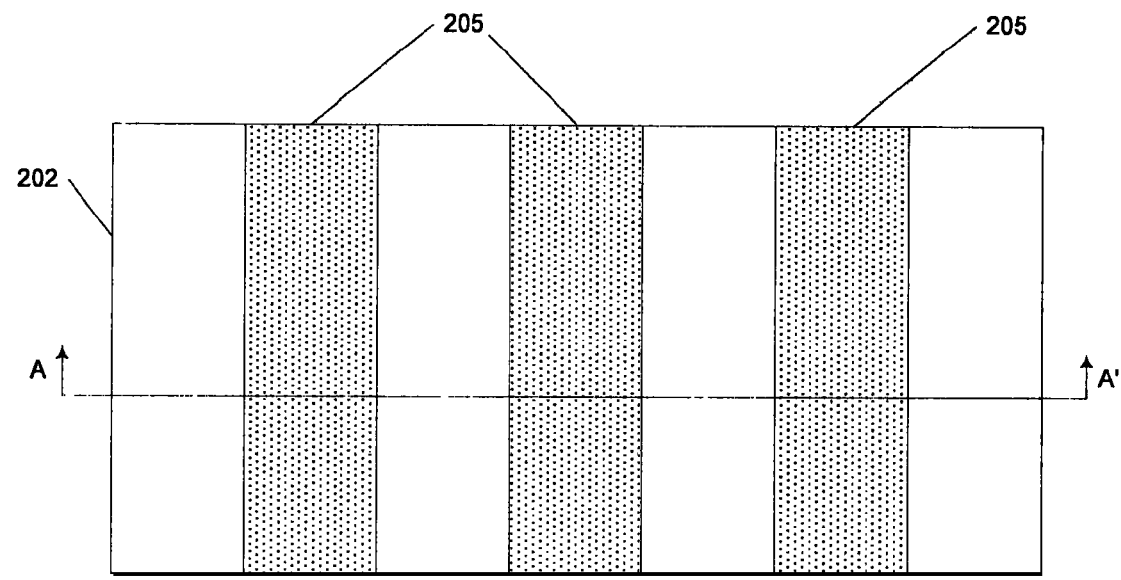

As illustrated in FIG. 4, conventional photolithography techniques can be used to pattern and etch layers 204 and 206. FIG. 5 is a diagram illustrating a top view of the layers comprising the device as fabricated to this point. FIG. 4 is a cross sectional view of FIG. 5 along the line AA'. Thus, as can be seen in FIG. 5, layers 206 and 204 have been patterned and etched into regions 205 that traverse insulating layer 202 from top to bottom. As will be explained below, regions 205 will form the bit lines of first bit line layer 110 shown in FIG. 2.

Figure 6:
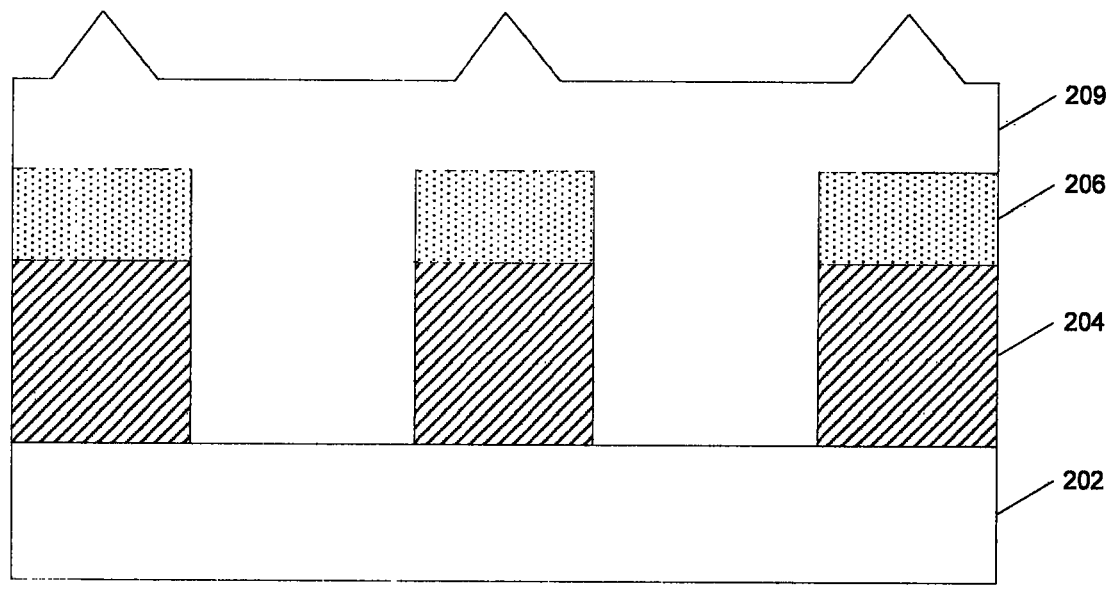
Figure 7:
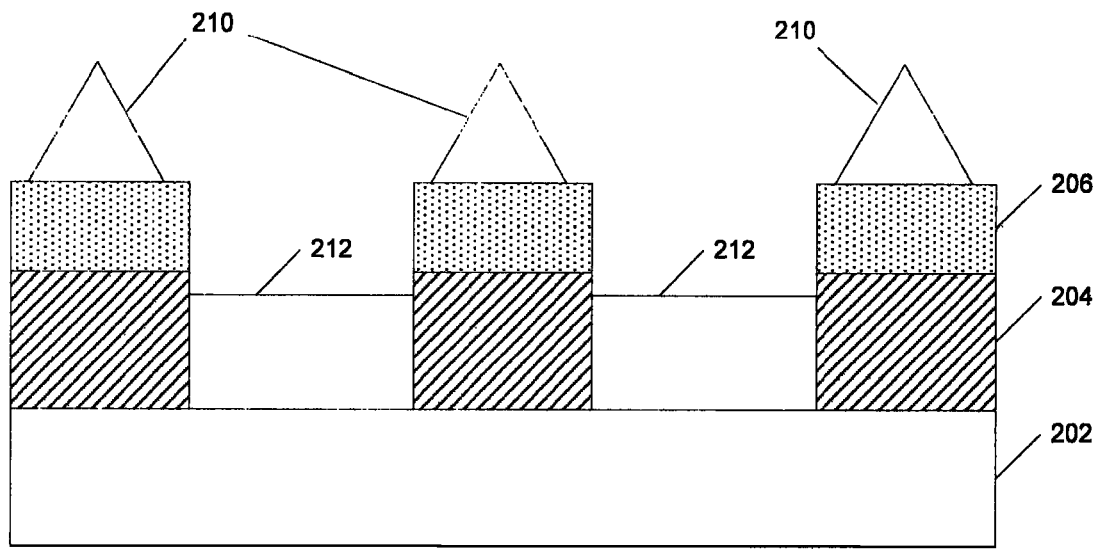

Referring to FIG. 6, a dielectric layer 209 can then be formed over insulating layer 202 as illustrated. Dielectric layer 209 can be, for example, a silicon dioxide ($SiO_2$) layer and can be form using High Density Plasma (HDP)—Chemical Vapor Deposition (CVD). Referring to FIG. 7, a portion of dielectric layer 209 is removed to expose the remaining portions of cap layer 206 and pail of the remaining portions of semiconductor layer 204. For example, a conventional wet etching, i.e., isotropic, process can be used to remove a portion of dielectric layer 209. Removing the right amount of dielectric layer 209 can be achieved by having a high etching selectivity ratio between dielectric layer 209 and cap layer 206. The etching process produces dielectric regions 210 on top of cap layer 206 as well as dielectric regions 212 in between the remaining portions of semiconductor layer 204.

Figure 8:
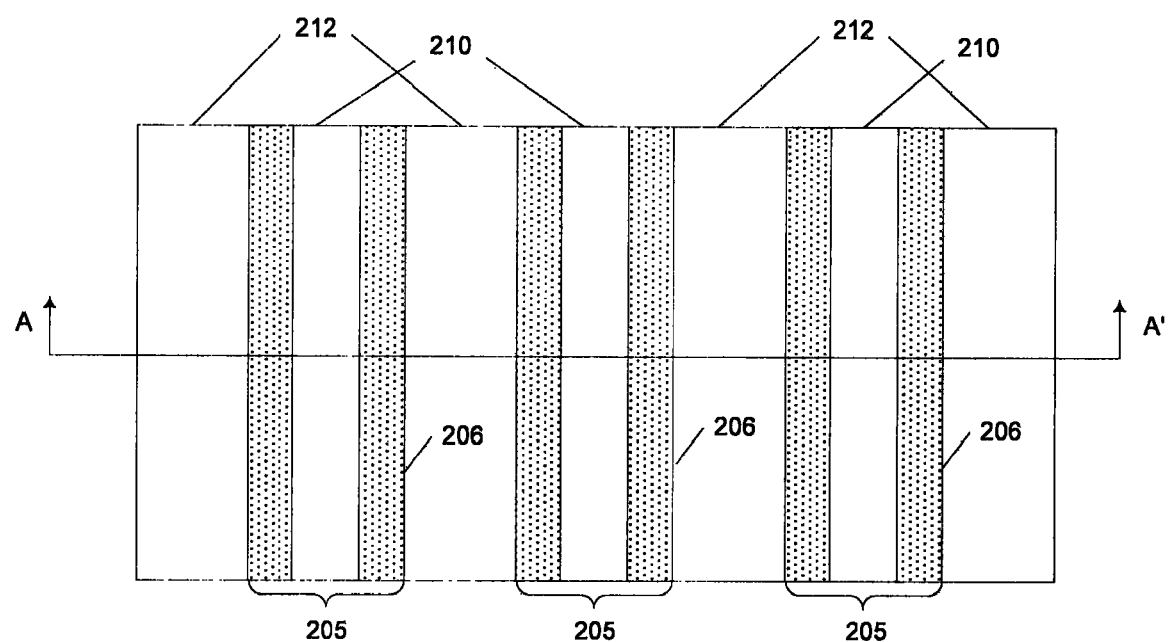

FIG. 8 is a diagram illustrating a top view of the layers as fabricated to this point. FIG. 7 is a cross-sectional view of the layers along the line AA'. Thus, as can be seen in FIG. 8, dielectric regions 212 now reside between regions 205. Dielectric regions 210 are illustrated as covering a portion of cap layer 206.

Figure 9:
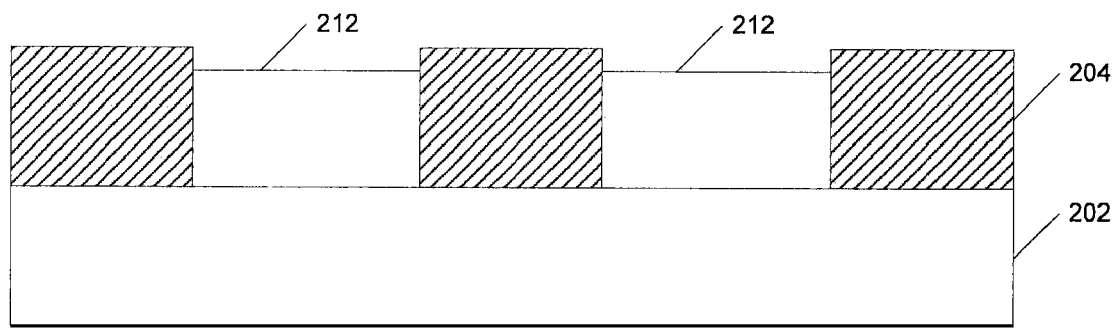

Referring to FIG. 9, the remaining portions of cap layer 206 can be removed, removing regions 210 of dielectric layer 209 in the process. For example, a hot phosphoric acid can be used to remove the remaining portions of cap layer 206. Regions 210 of dielectric layer 209 will automatically be moved during the removal of the remaining portions of cap layer 206, because portions 210 are disconnected from dielectric regions 212.

The process illustrated in FIGS. 6-9 are described in U.S. Pat. No. 6,380,068, entitled "Method for Planarizing a Flash Memory Device," assigned to the assignee of the present application, issued Apr. 30, 2002, and incorporated herein by reference as if set forth in full. The process described in FIGS. 6-9 results in an efficient planarization of the remaining surfaces illustrated in FIG. 9. Accordingly, the fabrication processes described herein are compatible with newer, efficient processing techniques. This makes the fabrication of stacked non-volatile memory devices efficient and cost-effective.

Figure 10:
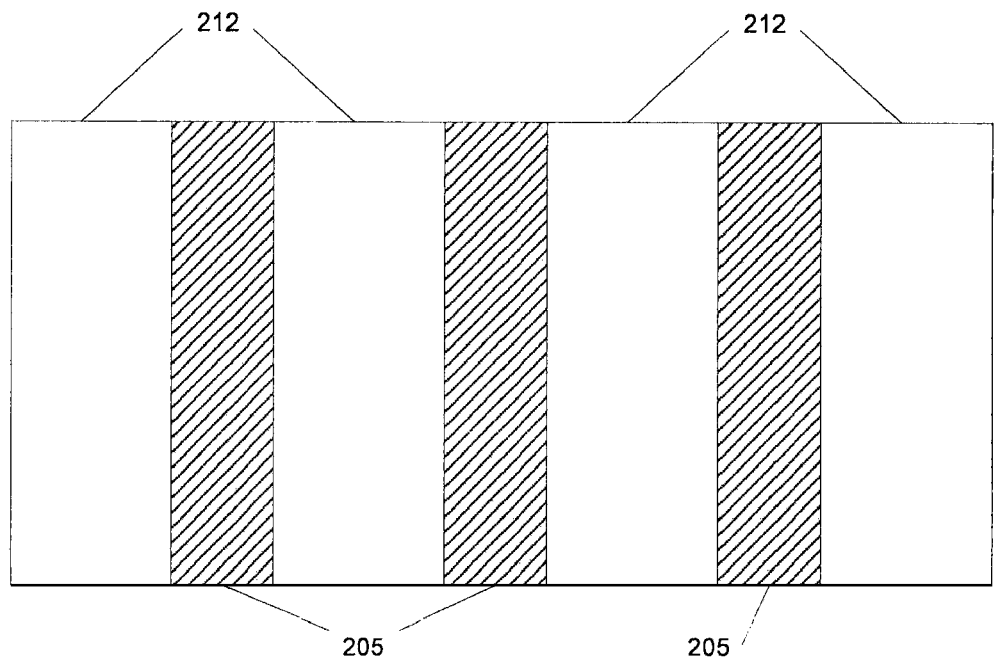

FIG. 10 is a top view of the layers formed thus far. FIG. 9 is a cross sectional view along the lines AA' of the layers illustrated in FIG. 10. Accordingly, insulating layer 202 is now covered by alternating oxide regions 212 and bitlines 205 formed from the remaining portions of semiconductor material 204.

Figure 11:
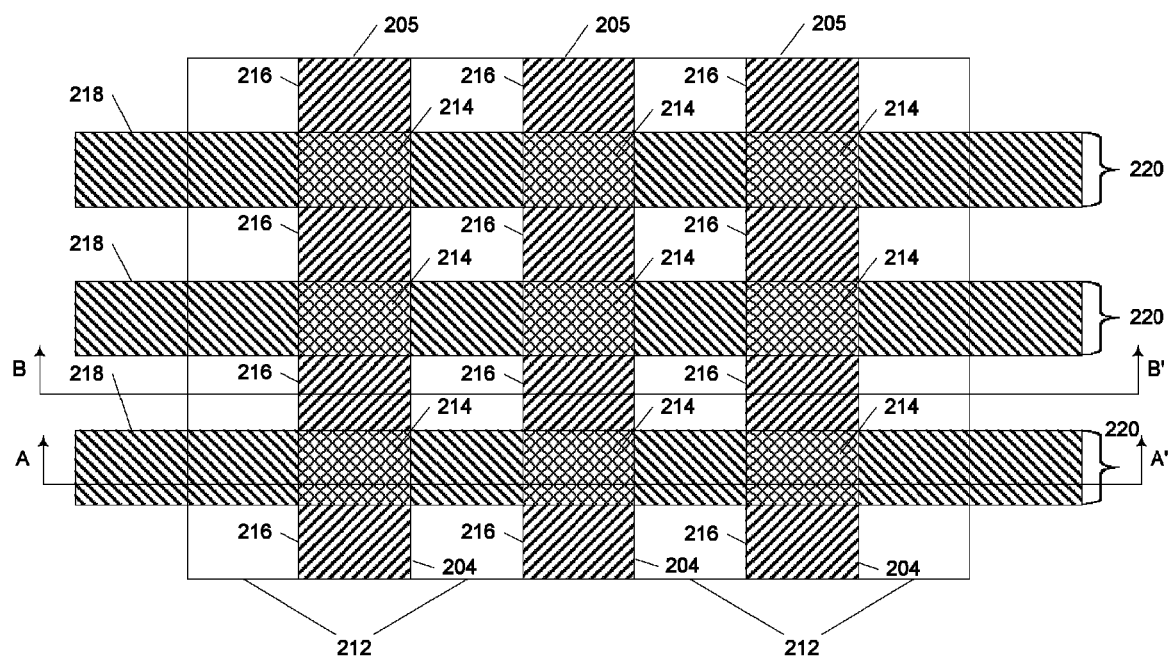
Figures 12, 13:
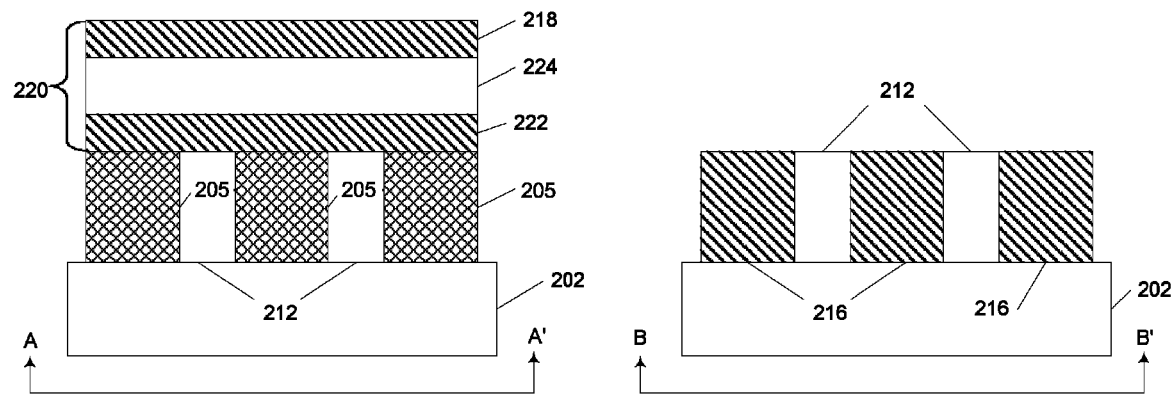

As illustrated in FIGS. 11-13, word lines 220 can then be formed over bit lines 205. As illustrated in FIG. 12, word lines 220 can be formed by first forming a trapping structure 222 over the remaining portions (bit lines 205) of semiconductor layer 204 and insulating regions 212. Word line conductor 224 can then be formed over trapping structure 222 and a second trapping structure 218 can be formed over word line conductor 224. A SiN layer (not shown) can then be formed over second trapping structure 218. These layers can then be patterned and etched using conventional photolithography techniques in order to produce word lines 220 as illustrated in FIG. 11. The etching can be configured such that HDP oxide region 212 acts as a stop for the etching process. Another HDP oxide layer (not shown) can then be formed over the etched word lines 220, including the SiN layer (not shown). The HDP layer can then be partially etched and part of the HDP oxide layer can be removed along with the remaining portion of the SiN layer (not shown) in a manner similar to that illustrated in FIGS. 6-9. This will leave HDP oxide regions 242 between word lines 220 as described below with respect to FIGS. 14 and 15.

In the example of FIGS. 11 and 12, trapping structures 218 and 222 we ONO structures. Thus, trapping structures 218 and 212 are formed by sequentially forming an oxide layer, a nitride layer, and an oxide layer. For example, the oxide layers can comprise $SiO_2$, and the nitride layer can comprise a SiN layer. As is understood, the nitride layer acts as a trapping layer for trapping charge during programming operations. The trapped charge will change the threshold voltage for the memory cell, which can be detected in order to determine the program state of the cell.

Figure 23A:
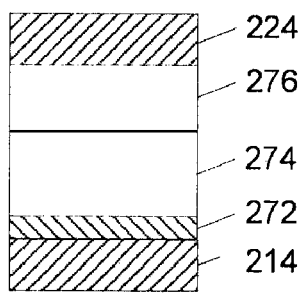
FIGS. 23A-23H are diagrams illustrating example structures that can be used to form a trapping structure in the device of FIG. 2.

FIGS. 23A-23H are diagrams illustrating example embodiments of various trapping structures that could be used in device 100. For example, referring to FIG. 12, the structures illustrated in FIGS. 23A-23H can be used for trapping structure 222. The first example embodiment illustrated in FIG. 23A comprises a Silicon-Oxide-Nitride-Oxide-Silicon (SONOS) structure. This structure comprises an oxide layer 272, nitride layer 274, and oxide layer 276 sequentially formed over polysilicon layer 214. Oxide region 272 acts as a tunnel dielectric layer and nitride layer 274 act as a trapping layer for trapping charge. When the SONOS structure of FIG. 23A is used, charge is stored in trapping layer 274 of a particular cell by injection of holes into trapping layer 274. A cell can be erased through the direct tunneling of holes into trapping layer 274, where they compensate for any electrons previously stored in trapping layer 274. The tunneling of holes in the trapping layer 274 is achieved via Fowler-Nordheim tunneling. Oxide layer 272 can be a thin oxide layer, e.g., less than 3 nanometers thick. Cells formed using the SONOS trapping structure illustrated in FIG. 23A can, e.g., be used for NAND memory applications.

NAND devices constructed using the SONOS trapping structure illustrated in FIG. 23A, can exhibit somewhat poorer charge retention due to leakage current that results from the direct tunneling of holes into trapping layer 274 during charge retention.

Figure 23B:
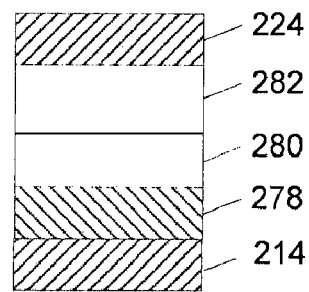

FIG. 23B illustrates a nitride read-only memory trapping structure. Again, the nitride read-only memory trapping structure comprises an ONO structure formed by sequentially forming an oxide layer 278, nitride layer 280, and a second oxide layer 282, over polysilicon region 214. Here, however, oxide layer 278 comprises a thickness in the range of approximately 5-7 nanometers. A cell formed using the nitride read-only memory structure of FIG. 23B is programmed via injection of electrons into layer 280. A cell formed using the nitride read-only memory structure of FIG. 23B can then be erased via hot hole erase techniques. The nitride read-only memory structure of FIG. 23B can be used for NOR applications; however, devices constructed using the nitride read-only memory structure of FIG. 23B exhibit some degradation due to the hot hole erase procedure.

Figure 23C:
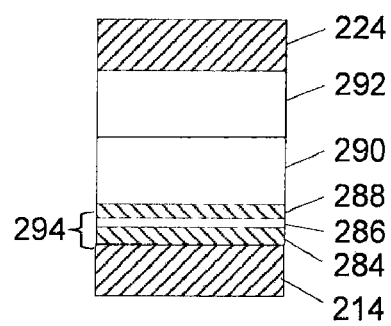

FIG. 23C is a diagram illustrating a band-gap engineered (BE)-SONOS structure. The BE-SONOS structures of FIG. 23C is fabricated by sequentially forming an ONO structure 294 followed by a nitride layer 290 and a dielectric layer 292. ONO structure 294 is thus formed by sequentially forming an oxide layer 284, nitride layer 286, and an oxide layer 288 over polysilicon layer 214. As with the SONOS structure of FIG. 23A, the BE-SONOS structure of FIG. 23C uses Fowler-Nordheim hole tunneling to erase the memory cells. However, the BE-SONOS structure of FIG. 23C does not exhibit the poor retention that results from direct tunneling leakage, or device degradation that results from hot hole erase damage. Further, the BE-SONGS structure of 23C can be used for both NOR and NAND applications.

Figure 23D:
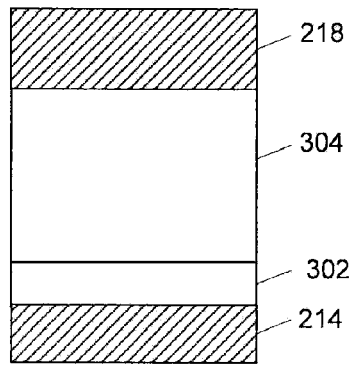
Figure 23E:
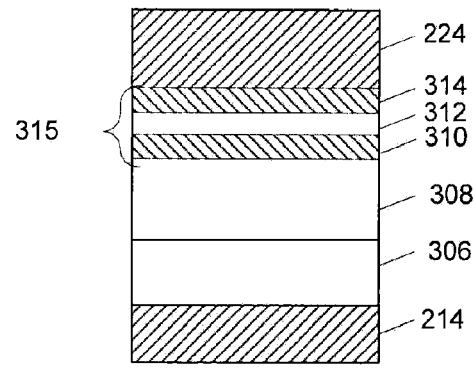
Figure 23F:
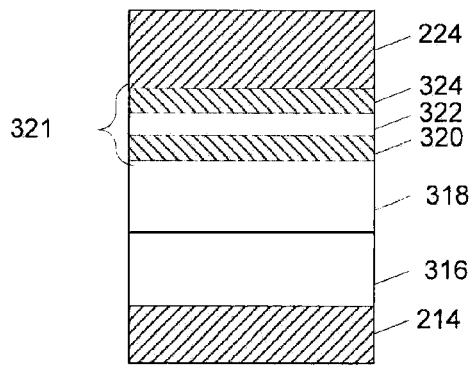
Figure 23G:
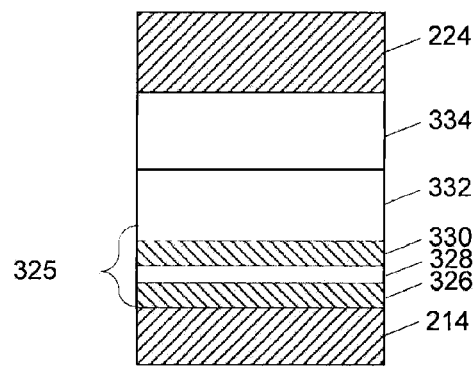
Figure 23H:
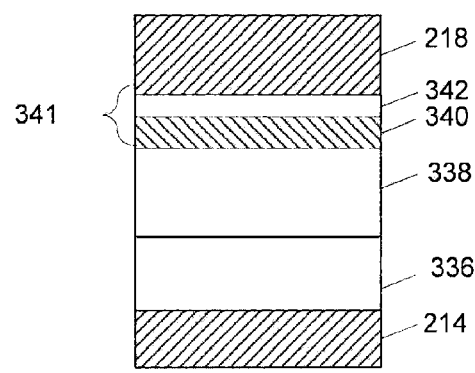
Figure 23I:
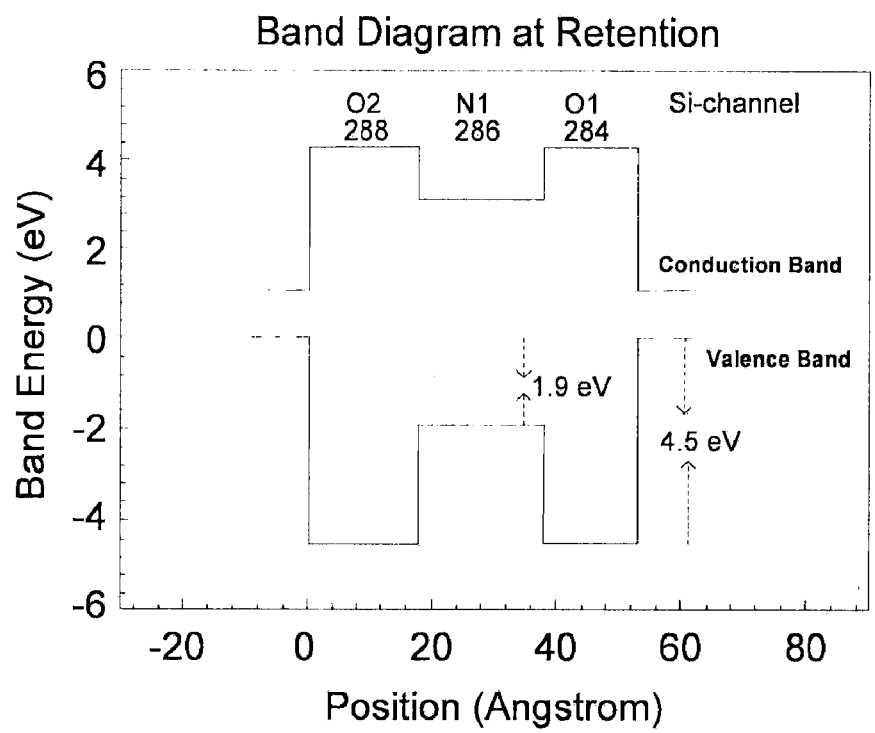
FIGS. 23I-23J are band diagrams for the structure illustrated in FIG. 23C.
Figure 23J:
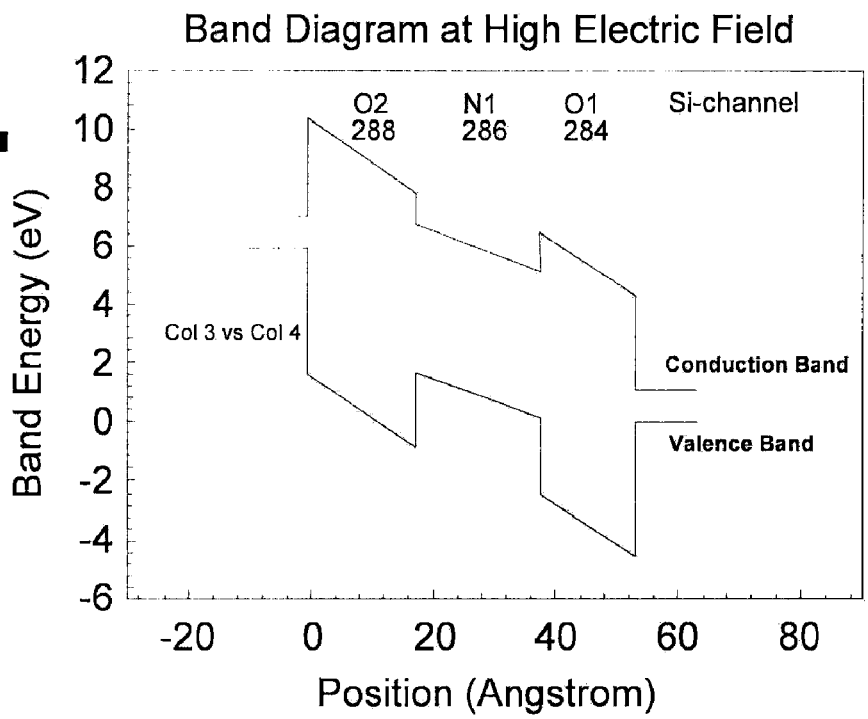

FIGS. 23I and 23J are band diagrams illustrating the bands for ONO structure 294, of the BE-SONOS structure illustrated in FIG. 23C. FIG. 23I is a band diagram during data retention, and FIG. 23J is a band diagram during erase. As can be seen in FIG. 23I, during retention holes do not have sufficient energy to overcome the potential barriers of the layers comprising ONO structure 294. Data retention occurs when a low electric field exists across trapping structure 294. Because tunneling of holes is blocked by structure 294, there is little tunneling leakage during application of a low field. As illustrated in FIG. 23J, however, when a high field exists across trapping structure 294, the bands shift allowing holes to tunnel across structure 294. This is because the barriers presented by layers 286 and 288 are almost eliminated from the perspective of the holes, due to the band shift when a high field is present.

FIGS. 23D-23H illustrate other example structures that can be used for the trapping layers included in device 100. For example, FIG. 23D is a diagram illustrating a SONS structure that can be used for the trapping structures included in device 100. The structure illustrated in FIG. 23D comprises a thin oxide layer 302 formed over polysilicon layer 214. A nitride layer 304 is then formed over the thin oxide layer 302. Gate conducting layer 224 can then be formed over nitride layer 304. Thin oxide layer 302 acts as the tunnel dielectric and charge can be stored in nitride layer 304.

FIG. 23E is an example of a top BE-SONOS structure that can be used for trapping structures included in device 100. Accordingly, the structure illustrated in FIG. 23E comprises an oxide layer 306 formed over polysilicon layer 214. A nitride layer 308 is then formed over oxide layer 306, and ONO Structure 315 comprising an oxide layer 310, nitride layer 312 and oxide layer 314 is then formed over nitride layer 308. In the example of FIG. 23E, oxide layer 306 acts as the tunnel dielectric layer and charge can be trapped in nitride layer 308.

FIG. 23F is a diagram illustrating a bottom SONOSOS structure that can be used for the trapping layers included in device 100. The structure illustrated in FIG. 23F comprises an oxide layer 316 formed over polysilicon layer 214, and a nitride layer 318 formed over oxide layer 316. A thin oxide layer 320 is then formed over nitride layer 318 followed by a thin polysilicon layer 322. Another thin oxide layer 324 is then formed then over polysilicon layer 322. Accordingly, layers 320, 322 and 324 form an OSO structure near gate conductor 224. In the example of FIG. 23F, oxide layer 316 can act as the tunnel dielectric and charge can be stored in nitride layer 318.

FIG. 23G is a diagram illustrating a bottom SOSONOS structure. Here, a thin OSO structure 325 is formed over polysilicon layer 214. OSO structure 325 comprises thin oxide layer 326, a thin polysilicon layer 328, and a thin oxide layer 330. A nitride layer 332 can then be formed over OSO structure 325, and an oxide layer 334 can be formed over nitride layer 332. In the example of FIG. 23G, OSO structure 325 can act as the tunnel dielectric and charge can be stored in nitride layer 332.

FIG. 23H is a diagram illustrating an example SONONS structure that can be used for the trapping structures included in device 100. Here, an oxide layer 336 is formed over polysilicon layer 214 and a nitride layer 338 is formed over oxide layer 336. An ON structure 341 is then formed over nitride layer 338. ON structure 341 comprises a thin oxide layer 340 formed over nitride layer 338, and a thin nitride layer 342 formed over thin oxide layer 340. In the example of FIG. 23H, oxide layer 336 can access the tunnel dielectric and charge can be trapped in nitride layer 338.

In other embodiments, the trapping structure can comprise a SiN or a SiON, or a Hi-K material such as $HfO_2$, $Al_2O_3$, AlN, etc. In general, any trapping structure or material can be used as long as it meets the requirements of a particular application.

Word line conductor 224 can be formed from a N+ or P+ conductor material, such as polysilicon material, polysilicon/silicide/polysilicon material, or a metal such as aluminum (Al), copper (Cu), or tungsten (W).

Once word lines 220 are formed, source and drain regions 216 can be formed in the areas of semiconductor layer 204 comprising bit lines 205 that are not covered by word lines 220. Accordingly, these source and drain regions 216 can be implanted and heat driven into regions 216 of semiconductor layer 204. As will be understood, this process is a self-aligned process. In the example of FIG. 11, the source and drain region should be N+ regions formed using, e.g., arsenic (As) or phosphorous (P), since semiconductor layer 204 comprises P-type semiconductor material. It will be understood that P+ regions should be formed in embodiments that use N-type semiconductor material.

After formation of source and drain regions 216, semiconductor layer 204 will comprise source/drain regions 216 which are doped as N+ regions, and P-type regions 214 which remain under word lines 220. As explained below, these P-type regions 214 will form the channel regions for particular memory cells.

Figure 14:
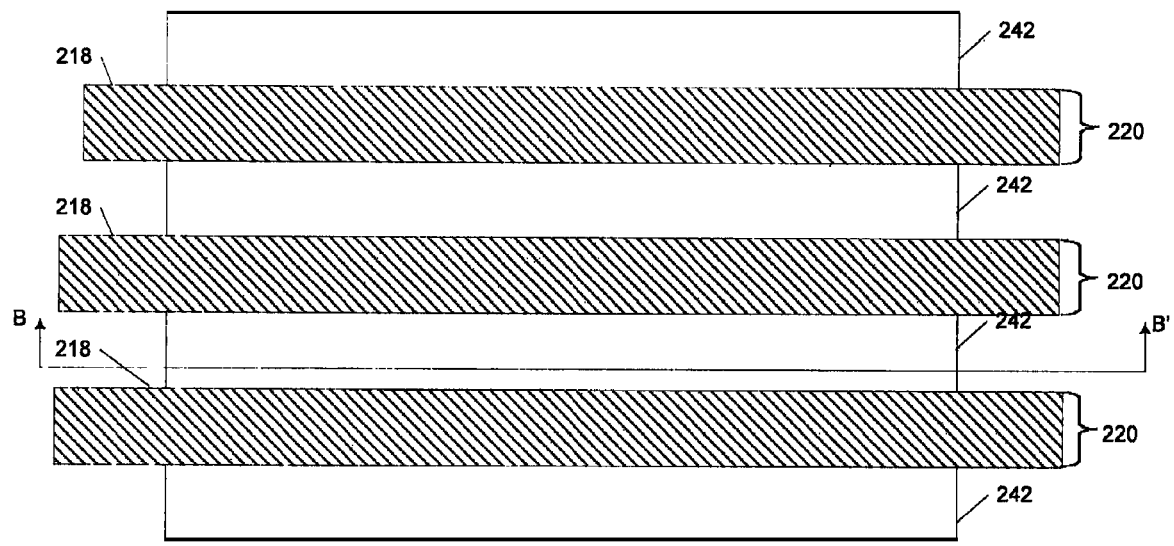
Figure 15:
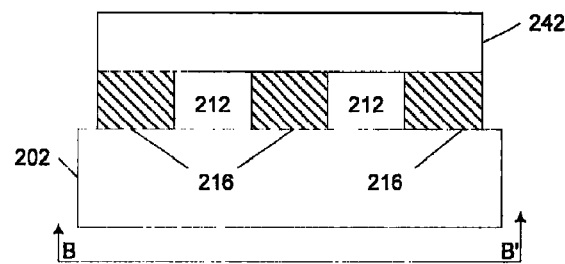

FIG. 12 is a cross-section along the line AA' of the layers illustrated in FIG. 11. As can be seen, P-type regions 214 remain under word lines 220 separated by dielectric regions 212. FIG. 13 is a diagram illustrating a cross-section along the line BB'. As can be seen in FIG. 13, N+ doped regions 216 are formed between word lines 220 and are separated by dielectric regions 212. As illustrated in FIGS. 14 and 15. HDP oxide regions 242 can be formed between word lines 220.

Figure 16:
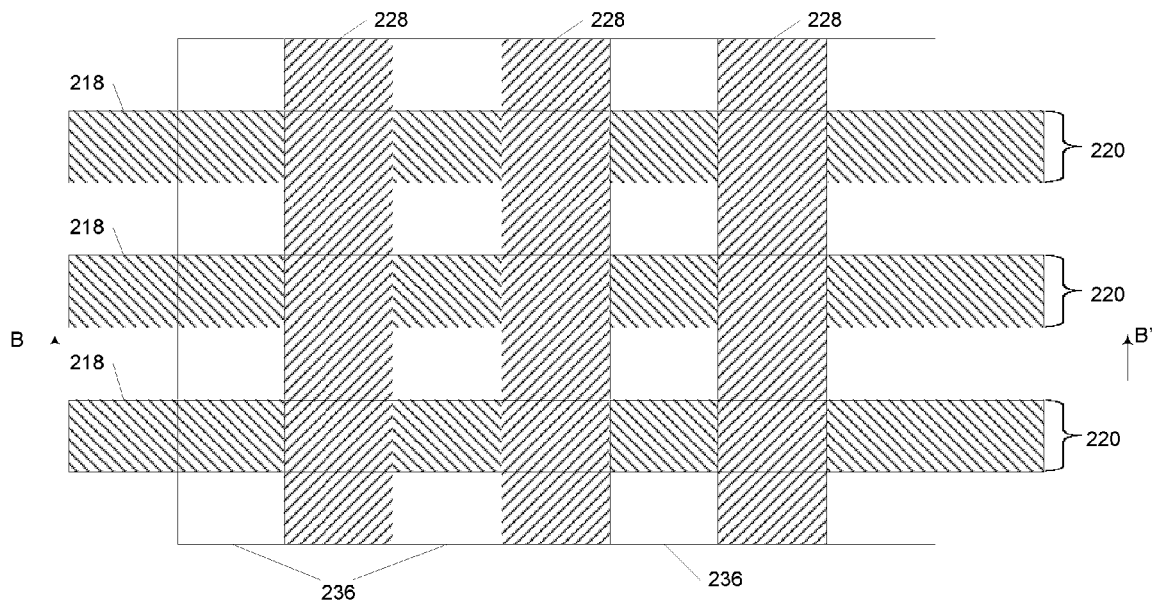
Figure 17:
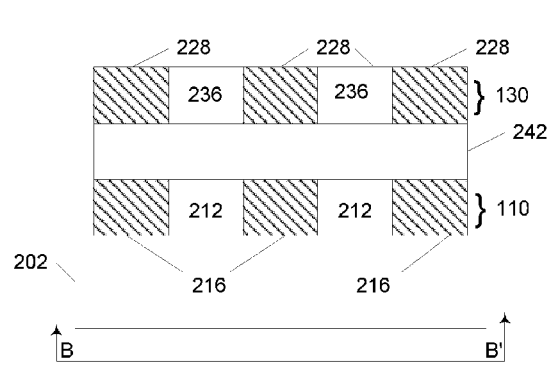
Figure 18:
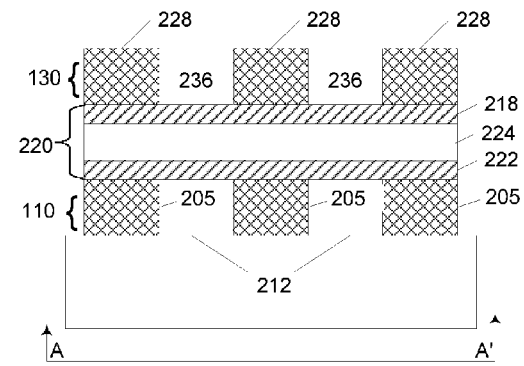

As illustrated in FIGS. 16-18, a second bit line layer (e.g., bit line layer 130, see FIG. 2) can then be formed over word lines 220. Accordingly, bit lines 228 can be formed over word lines 220 as illustrated in FIG. 16. These bit lines can be formed using the same process used to form bit lines 205 as illustrated in FIGS. 6-9. Bit lines 228 will thus be separated by dielectric regions 236. FIG. 17 is a diagram illustrating a cross-sectional view along the line BB'. As can be seen, first bit line layer 110 is separated from second bit line layer 130 by HDP oxide 242 in the areas in between word lines 220. FIG. 18 is a diagram illustrating a cross-sectional view along a word line 220. As can be seen, bit lines 228 are formed over word lines 220, which are formed over the bit lines 205.

Figure 19:
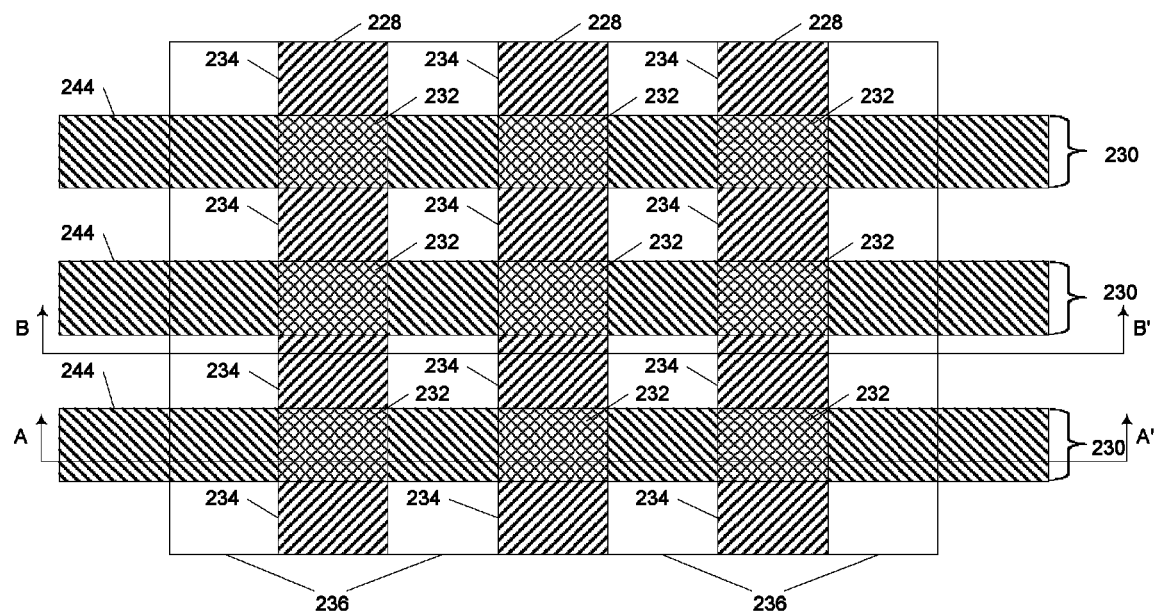
Figure 20:
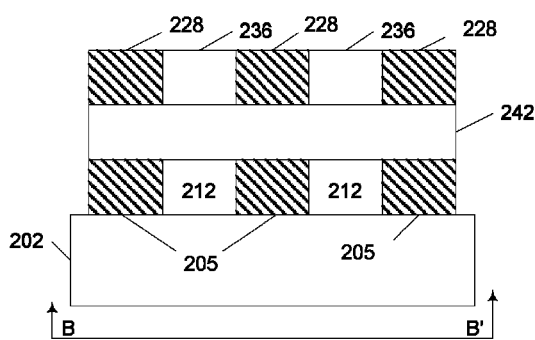
Figure 21:
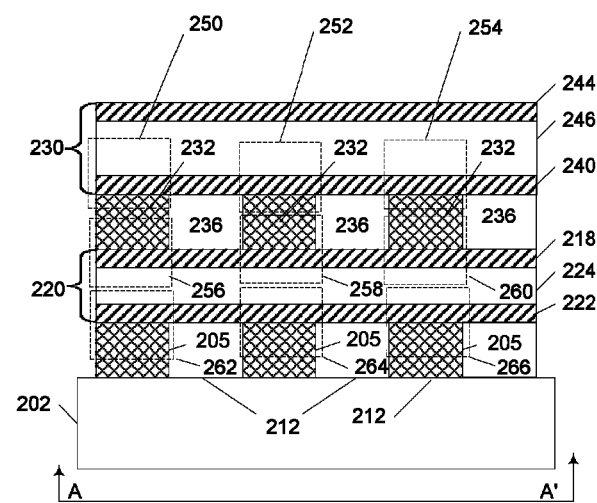

As illustrated in FIGS. 19-21, word lines 230 can then be formed over bit lines 228 in order to form a second word line layer (e.g., word line layer 140). As with word lines 220, word lines 230 can comprise a word line conductor 246 sandwiched between trapping structures 240 and 244. This is illustrated in FIG. 21 which is a cross sectional view along the line AA' of the layers illustrated in FIG. 19. FIG. 20 is a cross sectional view along the line BB'.

Thus, in the example of FIG. 21 trapping structures 240 and 244 are formed by sequentially forming an oxide layer, a nitride layer, and an oxide layer. For example, the oxide layers can comprise $SiO_2$, and the nitride layer can comprise a SiN layer. As is understood, the nitride layer acts as a trapping layer for trapping charge during device programming operations. The trapped charge will change the threshold voltage for the memory cell, which can be detected in order to determine the program state of the cell.

In other embodiments, trapping structures 240 and 244 can comprise one of the structures illustrated in FIGS. 23A-23H.

In other embodiments, the trapping structure can comprise a SiN or a SiON, or a Hi-K material such as $HfO_2$, $Al_2O_3$, AlN, etc. In general, any trapping structure or material can be used as long as it meets the requirements of a particular application.

Word line layer 246 can be formed from a N+ or P+ conductor material, such as polysilicon material polysilicon/silicide/polysilicon material, or a metal such as aluminum (Al), copper (Cu), or tungsten (W).

Once word lines 230 are formed, source and drain regions 234 can be formed in the areas of bit lines 228 that are not covered by word lines 230. Accordingly, these source and drain regions 234 can be implanted and heat driven into bit lines 228. As will be understood, this process is a self-aligned process. In the example of FIG. 19, the source and drain regions should be N+ regions formed using, e.g., arsenic (As) or phosphorous (P), since bit lines 228 comprise P-type semiconductor material. It will be understood that P+ regions should be formed in embodiments that use N-type semiconductor material.

After formation of source and drain regions 234, bit lines 228 will comprise source/drain regions 234 which are doped as N+ regions, and P-type regions 232 which remain under word lines 230. As explained below, these P-type regions 232 will form the channel regions for particular memory cells.

Figure 22:
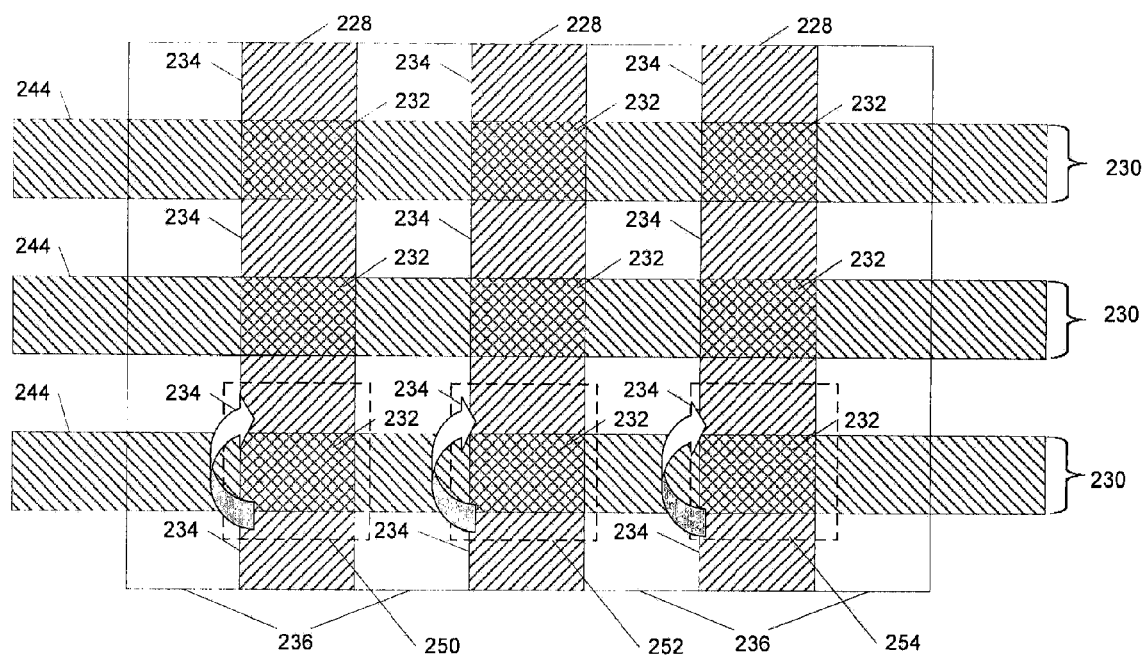
FIG. 22 is a diagram illustrating the current path for a selected memory cell in a NAND type array fabricated using the steps illustrated in FIGS. 3-21.

As illustrated in FIG. 22, the process described in FIGS. 3-21 produces a stacked memory array comprising a plurality of memory cells. Three such cells 250, 252, and 254 are illustrated by way of example in FIG. 22. Regions 234 form the source and drain regions for each cell, and current flows through the cells in the direction of the arrows. The cells can be configured for NAND operation. Cells 250, 252, and 254 are in the top layer of the array; however, the array comprises a plurality of cell layers stacked on top of each other. This can be illustrated in the cross sectional view of FIG. 21.

As can be seen in FIG. 21 trapping structure 240 forms the gate structure for cells 250, 252, and 254, regions 236 below trapping structure 240 form the channel regions for cells 250, 252, and 254, and source/drain regions 234 on either side of word line 230 form the source and drain regions for cells 250, 252, and 254 (see FIG. 22). Additionally, trapping structure 218 can form the gate structure for a layer of memory cells, e.g., cells 256, 258, and 260, below cells 250, 252, and 254. Regions 236 above trapping structure 218 form the channel regions for cells 256, 258, and 260, and source/drain regions 234 on either side of word line 230 form the source and drain regions for cells 256, 258, and 260. Here, the conducting conductor 224 forms the word line for supplying voltages to the gate structures of the cells 256, 258, and 260.

A third layer of memory cells, e.g., cells 262, 264, and 266, resides below cells 256, 258, and 260, as illustrated in FIG. 21. Trapping structure 222 forms the gate structures for these cells. The conducting layer 224 forms the word line for supplying voltages to the gate structures of the various cells. Regions 214 below word line 220 form the channel regions for these cells, and regions 216 on either side of word line 220 form the source and drain regions for these cells.

Figure 24:
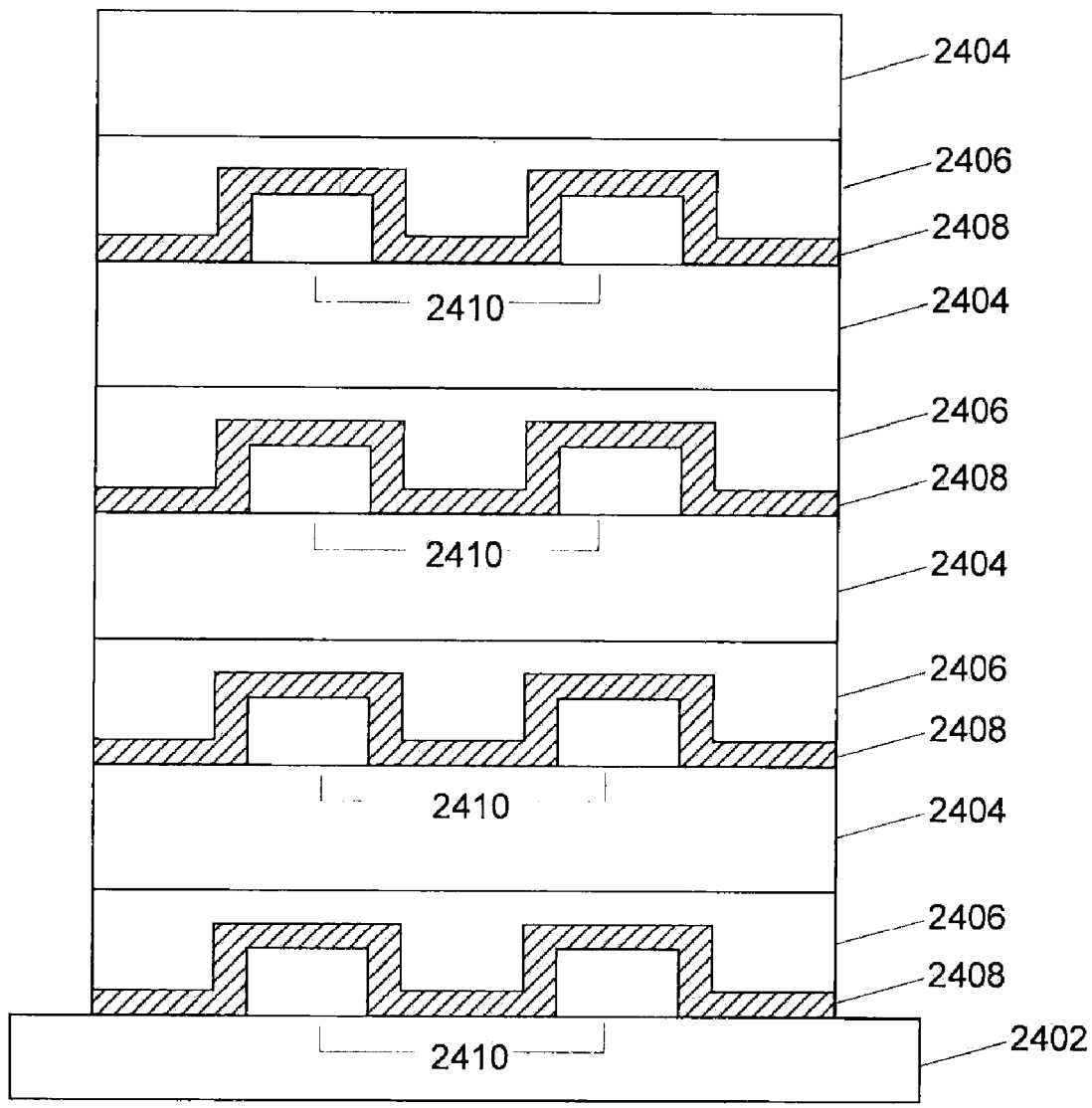
FIG. 24 is a diagram illustrating another example of a stacked non-volatile memory structure configured in accordance with one embodiment.

FIG. 24 is a diagram illustrating an example of a stacked non-volatile memory device configured in accordance with one embodiment. FIGS. 25-35 are diagrams illustrating a progression of steps for fabricating the device of FIG. 24 in accordance with another embodiment. The embodiment described with respect to FIGS. 24-35 presents a simpler design in which word lines are not shared between memory cells. As can be seen in FIG. 24, the process illustrated in FIGS. 24-35 produces a stacked memory structure that comprises an insulator or dielectric layer 2402 with word line and bit line layers stacked on top of insulator 2402 and separated by inter-layer, or inter-module dielectric layers 2404. The word line and bit line layers comprise bit lines 2410 separated from word lines 2406 by trapping structures 2408. As described below, a bit line layer can be deposited and then patterned and etched to form bit lines 2410. A trapping structure layer can then be deposited and a word line layer can be deposited over the trapping structure layer. The word line and trapping structure layers can then be patterned and etched to form word lines over bit lines 2410. The trapping structure 2408 above bit lines 2410 and under word lines 2406 can then act as the trapping layer for storing charge in a memory cell.

Figure 25:
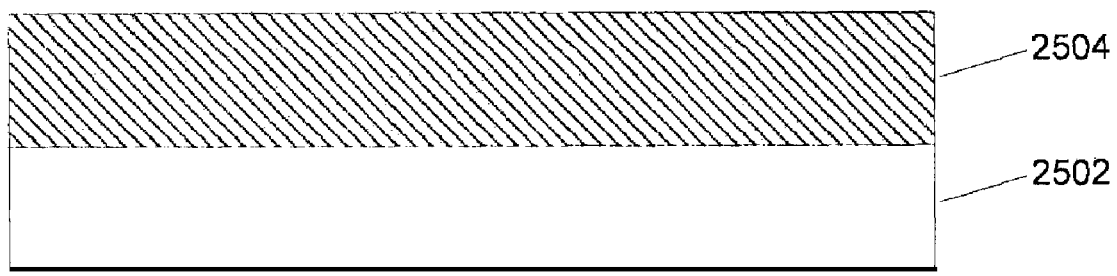

FIGS. 25-35 illustrate an example process for fabricating the device illustrated in FIG. 24. As illustrated in FIG. 25, a polysilicon layer 2504 can be deposited over an insulating layer 2502. Insulating layer 2502 can comprise an oxide material, e.g., a silicon dioxide material (SiO). Polysilicon layer 2504 can have a thickness in the range of approximately 200-1,000 Å. For example, the thickness of polysilicon layer 2504 can, in certain embodiments, preferably be approximately 400 Å.

Figure 26:
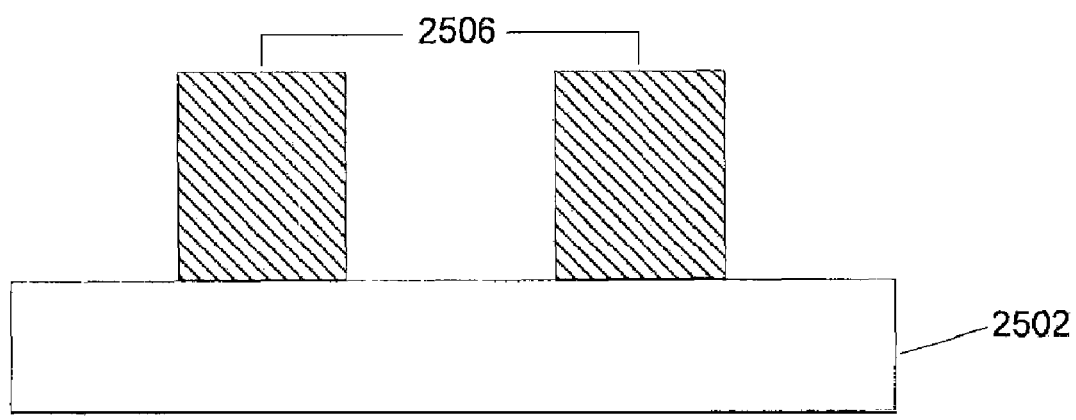

Referring to FIG. 26, polysilicon layer 2504 can then be patterned and etched using conventional photolithography processes in order to produce bit line regions 2506. For example, insulating layer 2502 can be used as an etch stop for the etching process in order to produce regions 2506. The overall thickness of the layers illustrated in FIG. 26 can be between approximately 200-1000 Å, and can be preferably with the approximately 400 Å.

Figure 27A:
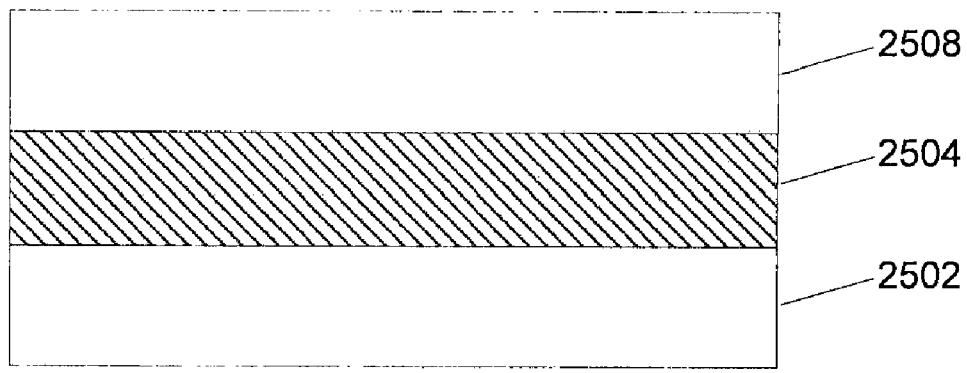
Figure 27B:
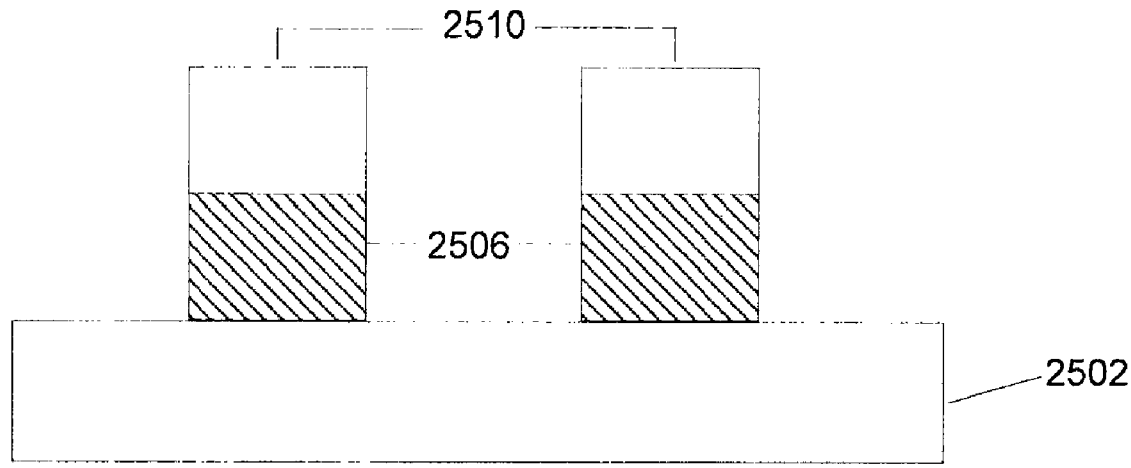
Figure 27C:
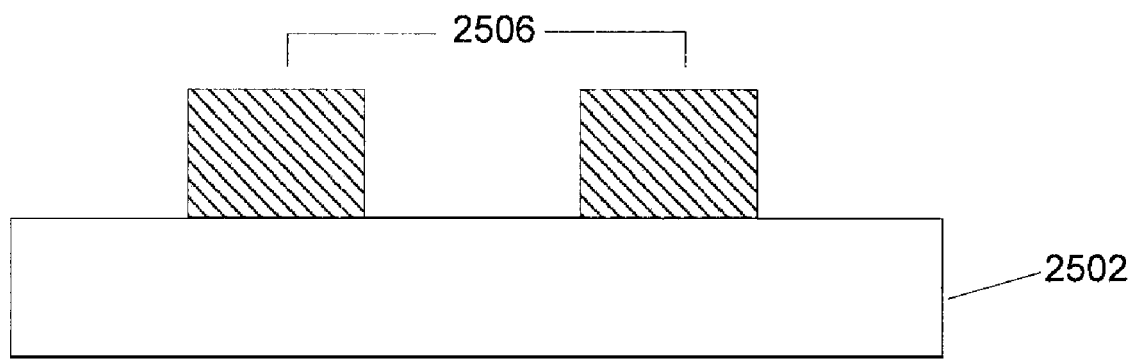

FIGS. 27A-27C, illustrate an alternative process for etching polysilicon layer 2504 in order to produce bit line regions 2506. Referring to FIG. 27A, a cap layer 2508 can be formed over polysilicon layer 2504. For example, cap layer 2508 can comprise a silicon nitride (SiN) layer. Polysilicon layer 2504 and cap layer 2508 can then be patterned and etched using conventional photolithography techniques as illustrated in FIG. 27B. Again, insulating layer 2502 can act as an etch stop for the etching process.

Referring to FIG. 27C, after layers 2504 and 2508 are etched to produce regions 2506 and 2510, and cap layer 2508, regions 2510 can be removed using conventional processes.

Figure 28:
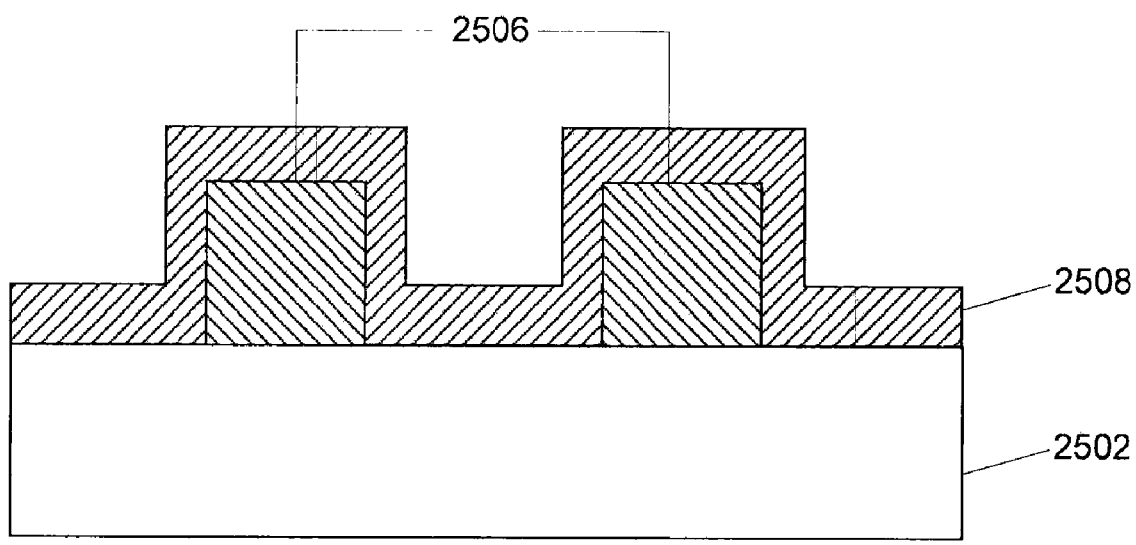

Referring to FIG. 28, a trapping structure layer 2508 can be formed over insulating layer 2502 and bit line regions 2506. As described above, trapping structure layer 2508 can comprise any of a plurality of trapping structures, such as SONOS, BE-SONOS, top BE-SONOS, SONONS, SONOSLS, SLSLNLS, etc. In other embodiments, trapping structure layer 2508 can comprise an SiN material, SiON material, or a high-K material such as $HfO_2$, $Al_2O_3$, AlN, etc.

Figure 31:
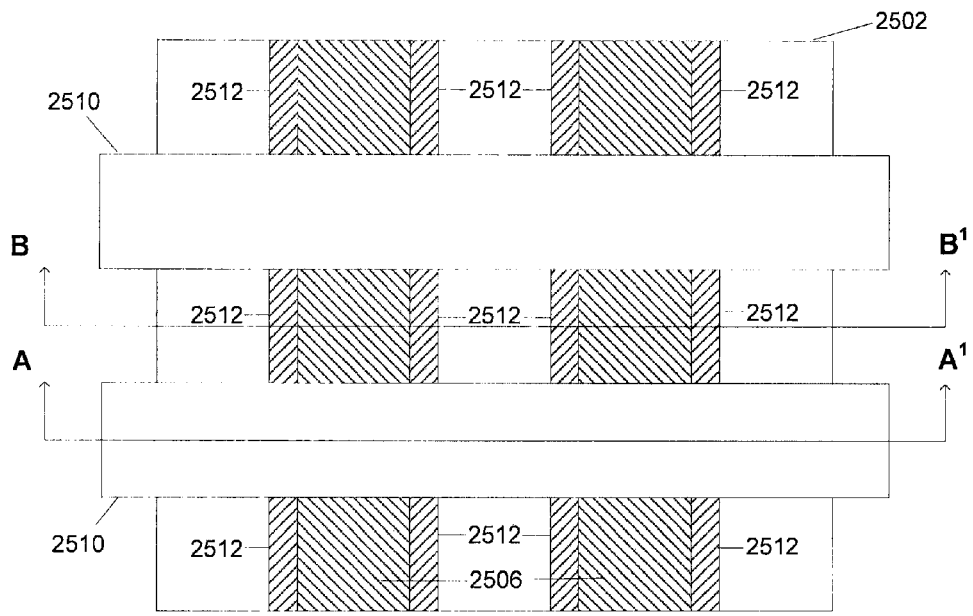
Figures 29, 30:
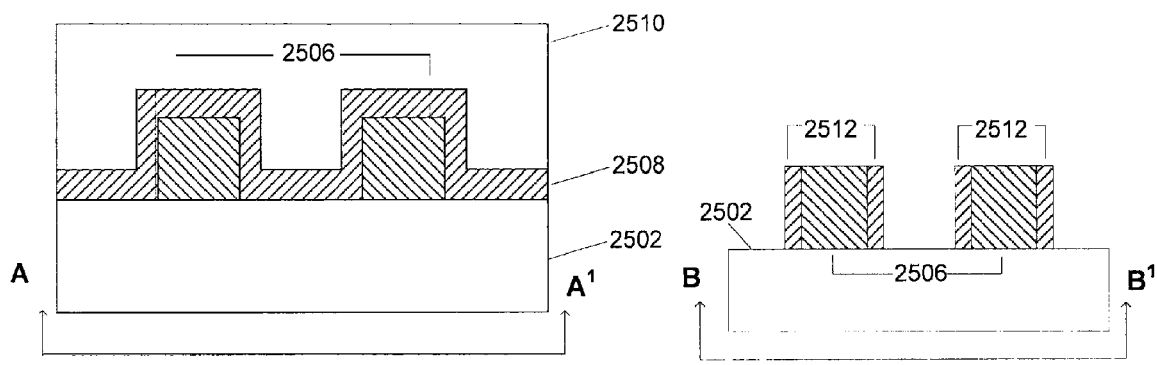

Referring to FIG. 29, a word line layer 2510 can then be formed over trapping structure layer 2508. For example, word line layer 2510 can comprise a polysilicon material deposited over trapping structure layer 2508. Layers 2510 and 2508 can then be patterned and etched using conventional photolithography techniques. As illustrated in FIG. 31, this will produce word lines 2510 over bit lines 2506.

As can be seen in FIG. 30, the etching process can be configured such that it etches through trapping structure layer 2508 in the regions in between word lines 2510. This can produce regions 2506 with regions 2512 of trapping structure layer 2508 remaining on the sides of regions 2506.

FIG. 31 is a diagram illustrating a top view of the layers as formed thus far. FIG. 29 is a diagram illustrating a cross-sectional view of the layers illustrated in FIG. 31 along the lines AA'. FIG. 30 is a diagram illustrating a cross-sectional view of the layers illustrated in FIG. 31 along the line BB'.

Referring to FIG. 34, source and drain regions 2514 can be deposited in the areas of bit lines 2506 that are not under word lines 2510. For example, if word lines 2506 are formed from a P-type polysilicon material, then N-type source/drain regions 2514 can be implanted and heat driven into the regions of bit lines 2506 that are not under word lines 2510. Alternatively, if word lines 2506 are formed from an N-type polysilicon material, then P-type source/drain regions can be implanted and heat driven into bit lines 2506.

FIG. 32 is a diagram illustrating a cross-sectional view of the layers illustrated in FIG. 34 along the line AA'. FIG. 33 is a diagram illustrating a cross-sectional view of the layers illustrated in FIG. 34 along the line BB'. Accordingly, it can be seen that bit lines 2506 now comprise channel regions 2516 under word line layer 2510. The source and drain regions 2514 are then formed on either side of word lines 2510. It will be understood that formation of source/drain regions 2514 is a self-aligned process.

Figure 35:
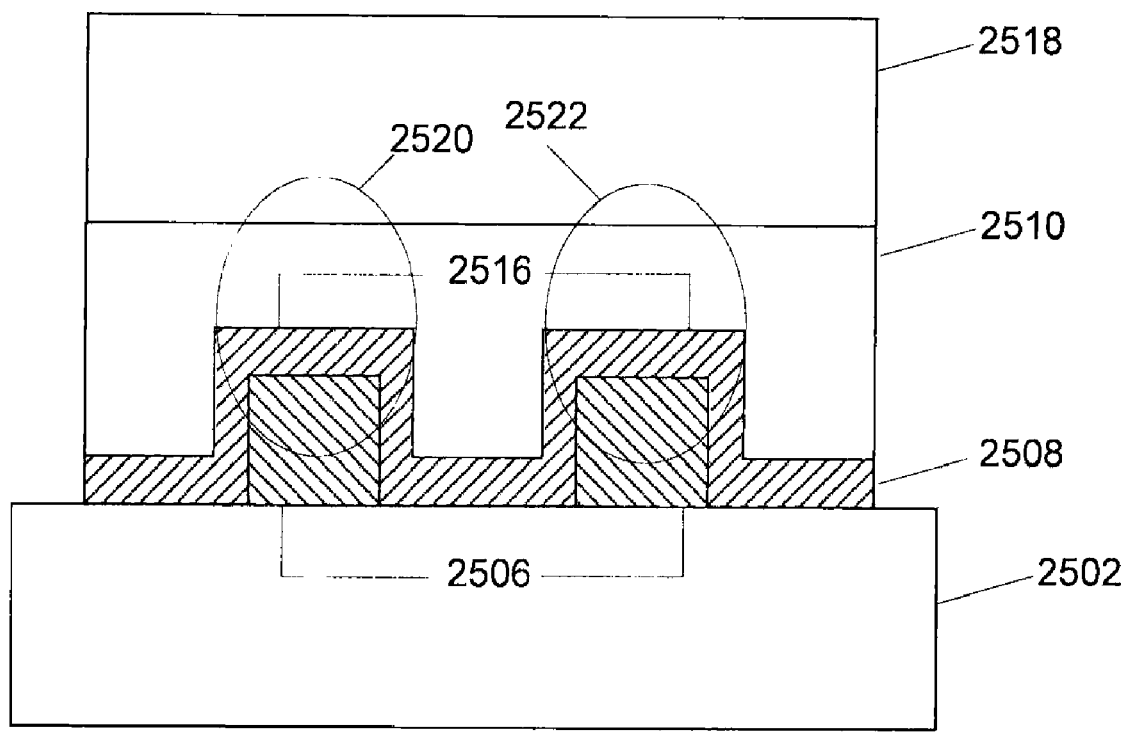

Referring to FIG. 35, an inter-layer, or inter-module dielectric layer 2518 can then be formed over word line layer 2510. Another bit line and word line layer can then be formed on top of inter-layer, or inter-module dielectric 2518 using the same processing steps as described above. In this manner, any number of word line and bit line layers, separated by an inter-layer, or inter-module dielectric 2518 can be formed over insulating layer 2502.

Referring to FIG. 34, memory cells 2520-2526 can then be formed in the structure illustrated. Memory cells 2520 and 2522 are illustrated in FIG. 35 as well. The source and drain regions for the memory cells are formed from source/drain regions 2514 on either side of the associated word lines 2510. The channel region is formed from the regions 2516 of bit lines 2506 under word lines 2510. The cells are tri-gate devices, which can suffer from excessive corner effect, but can also have increased cell current due to increased device width.

Figure 36:
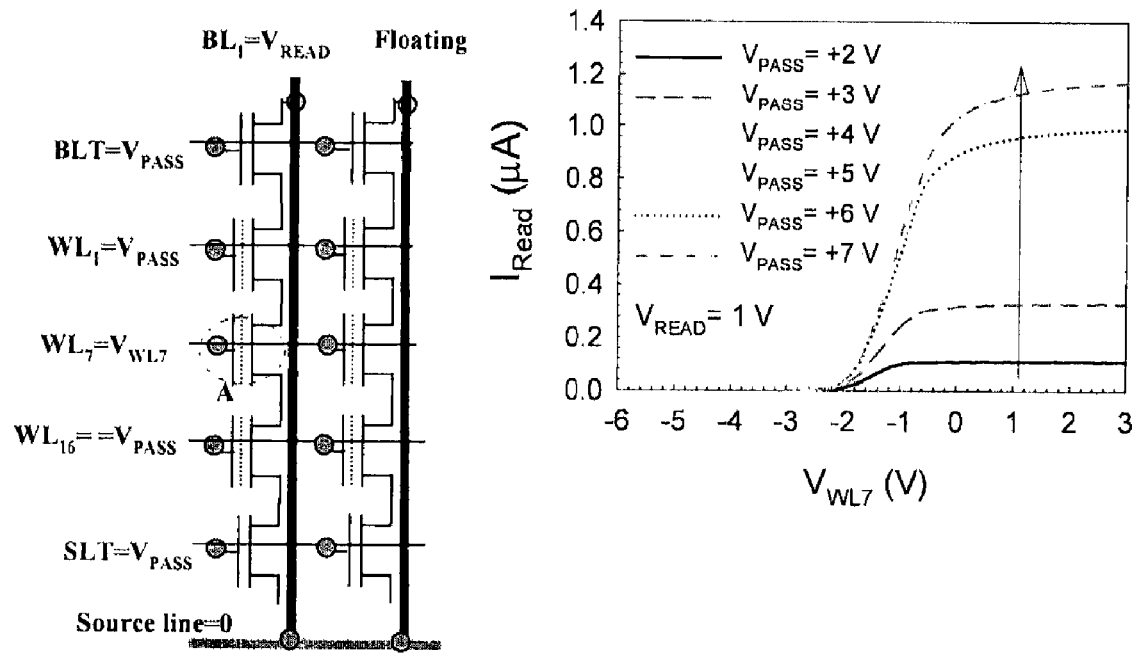
FIGS. 36 and 37 are diagrams illustrating example operating characteristics for a TFT NAND device fabricated in accordance with the methods illustrated in the above figures.
Figure 37:
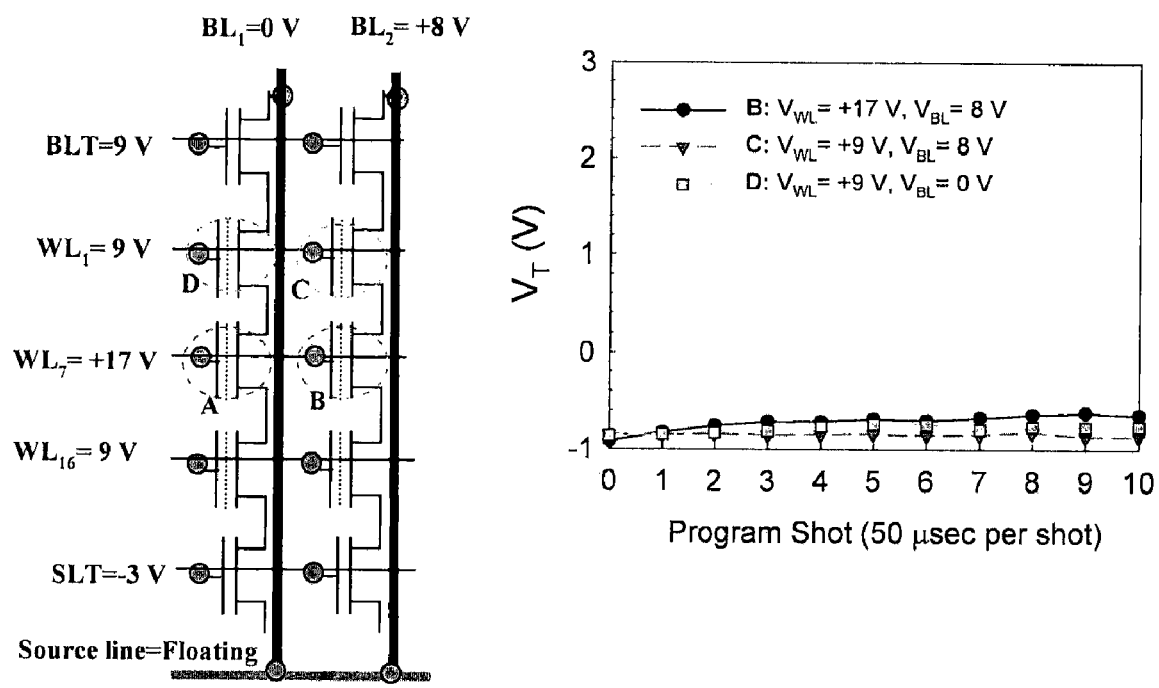

As noted above, the methods described herein can be used to form stacked NAND memory devices. FIGS. 36 and 37 are diagrams illustrating the operation characteristics for a 16-word-line NAND device configured in accordance with the methods described herein. During a read operation, a high voltage ($V_{READ}$) is applied to a first bit line ($BL_1$), while a bit line for a second layer of the stacked memory device is allowed to float and the source line is tied to 0V. A Cell (A) can then be read by applying a read voltage ($V_{PASS}$) to the word-line of cell (A). As the curves in FIG. 36 illustrate, a $V_{PASS}$ voltage of +7V creates a read current approaching 1 µA, which is sufficient for NAND operation.

FIG. 37 is a diagram illustrating a method for limiting the program disturb for cell adjacent to a cell being programmed. In FIG. 37, cell (A) is being programmed by applying a high voltage, e.g., approximately +17V, to the word line of cell (A). $BL_1$ is tied to 0V, while the source line is allowed to float. $BL_2$ is pulled up to approximately +8V, and the word line associated with cells (C) and (D) is pulled up to about +9V. Thus, cells (C) and (D) are under a medium field gate disturb, while cell (B) is program inhibited by raising the channel potential for cell (B). The graph of FIG. 37 illustrates that there is little noticeable program disturb for the program operation carried out under the conditions described above.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A method for fabricating a non-volatile memory device comprising a plurality of bit line layers and a plurality of word line layers sequentially formed on top of each other, the method comprising:
    forming a first bit line layer, wherein forming the first bit line layer comprises:
        forming a semiconductor layer on an insulator;
        patterning the semiconductor layer to form a plurality of bit lines;
    forming a first word line layer over the first bit line layer, wherein forming the first word line layer comprises:
        sequentially forming a first storage structure, a conducting layer and a second storage structure; and
        after said sequentially forming, patterning the first and second storage structures and the conducting layer to form a plurality of word lines to define memory cells including channel regions in the bit lines of the plurality of bit lines arranged in a NAND-type array.

2. The method of claim 1, wherein patterning and etching the semiconductor layer comprises:
    forming a cap layer over the semiconductor layer;
    etching the cap layer and the semiconductor layer to form bit line regions comprising remaining portions of the cap layer and the semiconductor layer;
    forming a dielectric layer over the etched cap and semiconductor layers;
    etching a portion of the dielectric layer to form dielectric regions between the bit line regions and on top of the remaining portions of the cap layer; and
    removing the remaining portions of the cap layer thereby removing the portions of the dielectric layer on top of the cap layer.

3. The method of claim 2, wherein the cap layer comprises a nitride layer.

4. The method of claim 2, wherein the dielectric layer comprises silicon dioxide.

5. The method of claim 4, wherein the silicon dioxide is deposited using high density plasma, chemical vapor deposition.

6. The method of claim 1, wherein forming each of the first and second storage structures comprises forming a silicon-oxide-nitride-oxide-silicon (SONOS) structure.

7. The method of claim 1, wherein forming each of the first and second storage structures comprises forming an oxide-nitride-oxide (ONO), nitride read only memory structure.

8. The method of claim 1, wherein forming each of the first and second storage structures comprises forming a silicon-oxide-nitride-silicon (SONS) structure.

9. The method of claim 1, wherein forming each of the first and second storage structures comprises forming a top silicon-oxide-nitride-silicon (SONOSOS) structure.

10. The method of claim 1, wherein forming each of the first and second storage structures comprises forming a bottom silicon-oxide-silicon-oxide-nitride-oxide-silicon (SOSONOS) structure.

11. The method of claim 1, wherein forming each of the first and second storage structures comprises forming a silicon-oxide-nitride-oxide-nitride-silicon (SONONS) structure.

12. The method of claim 1, wherein forming each of the first and second trapping structures comprises forming a silicon nitride (SiN) layer.

13. The method of claim 1, wherein forming each of the first and second storage structures comprises forming a SiON layer.

14. The method of claim 1, wherein forming each of the first and second storage structures comprises depositing a Hi-K material.

15. The method of claim 14, wherein the Hi-K material is $HfO_2$, AlN, or $Al_2O_3$.

16. The method of claim 1, further comprising forming source/drain regions in the regions of the plurality of bit lines not covered by the plurality of word lines.

17. The method of claim 16, wherein the semiconductor layer comprises a P-type semiconductor material, and wherein forming the source/drain regions comprises forming N+ regions in the P-type semiconductor material.

18. The method of claim 17, wherein the N+ regions are formed using As or P.

19. The method of claim 16, wherein:
    bit lines in the plurality of bit lines are spaced apart along a first direction; and
    the source/drain regions of respective memory cells are spaced apart in a corresponding bit line in the plurality of bit lines along a second direction transverse to the first direction.

20. The method of claim 19, wherein adjacent memory cells share a source/drain region.

21. The method of claim 1, wherein the conducting layer comprises polysilicon material.

22. The method of claim 21, wherein the conducting layer comprises polysilicon/silicide/polysilicon material.

23. The method of claim 21, wherein the conducting layer comprises a metal.

24. The method of claim 23, wherein the metal is aluminum, copper, or tungsten.

25. The method of claim 1, further comprising forming a second bit line layer over the first word line layer.

26. The method of claim 25, further comprising forming a second word line layer over the second bit line layer.

27. The method of claim 1, wherein:
    bit lines in the plurality of bit lines have a bit line width, and adjacent bit lines in the plurality of bit lines are spaced apart along a first direction by a bit line separation distance;
    word lines in the plurality of word lines have a word line width, and adjacent word lines in the plurality of word lines are spaced apart along a second direction by a word line separation distance; and
    the memory cells have an area, the area having a first side along the first direction and a second side along the second direction, the first side having a length equal to a sum of the bit line width and the bit line separation distance, the second side having a length equal to a sum of the word line width and the word line separation distance.

28. A method for fabricating a memory device comprising:
    forming a first plurality of semiconductor bit lines;
    forming a first multi-layer storage structure on the first plurality of semiconductor bit lines, forming word line material on the first multi-layer storage structure, and forming a second multi-layer storage structure on the word line material;
    patterning the first multi-layer storage structure, the word line material and the second multi-layer storage structure to expose portions of the first plurality of semiconductor bit lines, thereby forming a plurality of word lines comprising word line material;

forming a first plurality of doped regions within the exposed portions of the first plurality of semiconductor bit lines, the first plurality of doped regions having a conductivity type different from that of the first plurality of semiconductor bit lines, wherein memory cells in a first plurality of memory cells include a portion of the first multi-layer storage structure between a corresponding word line in the plurality of word lines and a channel region separated by a pair of doped regions in the first plurality of doped regions in a corresponding semiconductor bit line in the first plurality of semiconductor bit lines;

forming a second plurality of semiconductor bit lines on the second storage structure; and forming a second plurality of doped regions within the second plurality of semiconductor bit lines, the second plurality of doped regions having a conductivity type different from that of the second plurality of semiconductor bit lines, wherein memory cells in a second plurality of memory cells include a portion of the second storage structure between a corresponding word line in the plurality of word lines and a channel region separated by a pair of doped regions in the second plurality of doped regions in a corresponding semiconductor bit line in the second plurality of semiconductor bit lines.

* * * * *